US011985779B2

(12) United States Patent
Hobbs et al.

(10) Patent No.: US 11,985,779 B2
(45) Date of Patent: May 14, 2024

(54) CARTRIDGE-BASED COMPUTING SYSTEM

(71) Applicant: Dell Products L.P., Round Rock, TX (US)

(72) Inventors: Derric Christopher Hobbs, Round Rock, TX (US); Toshiyuki Tanaka, Tokyo (JP); Cyril Keilers, Georgetown, TX (US); Jonathan C. Giffen, Austin, TX (US); Tzu-Wei Tai, Taipei (TW); Jake Lavallo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 35 days.

(21) Appl. No.: 17/945,268

(22) Filed: Sep. 15, 2022

(65) Prior Publication Data

US 2023/0013709 A1    Jan. 19, 2023

Related U.S. Application Data

(63) Continuation of application No. 16/946,641, filed on Jun. 30, 2020, now Pat. No. 11,477,902.

(51) Int. Cl.
*H05K 5/02* (2006.01)
*G06F 1/16* (2006.01)
*H05K 5/00* (2006.01)
*H05K 5/03* (2006.01)

(52) U.S. Cl.
CPC ......... *H05K 5/0256* (2013.01); *G06F 1/1601* (2013.01); *H05K 5/0017* (2013.01); *H05K 5/0221* (2013.01); *H05K 5/0234* (2013.01); *H05K 5/03* (2013.01)

(58) Field of Classification Search
None
See application file for complete search history.

(56) References Cited

U.S. PATENT DOCUMENTS

| 8,144,452 | B2 * | 3/2012 | Huang | G06F 1/187 |
| | | | | 361/679.02 |
| 2007/0168593 | A1 * | 7/2007 | Montag | G06F 1/1632 |
| | | | | 710/303 |
| 2010/0188812 | A1 * | 7/2010 | Morrison | G06F 1/181 |
| | | | | 248/274.1 |
| 2015/0002994 | A1 * | 1/2015 | Kamepalli | G06F 1/1632 |
| | | | | 361/679.41 |

(Continued)

*Primary Examiner* — James Wu
*Assistant Examiner* — Christopher L Augustin
(74) *Attorney, Agent, or Firm* — Joseph Mencher

(57) ABSTRACT

A cartridge-based computing system includes a display stand that connects to a compute module cartridge including a first securing member, a second securing member, and a release member coupled to the second securing member. The display stand defines a securing aperture that engages the first securing member when the compute module cartridge is connected to the display stand, which causes the first securing member to engage a securing element on the display stand and move it into engagement with the second securing member to connect the compute module cartridge to the display stand. The securing element may then be engaged by the release member to move it out of engagement with the second securing member, and into engagement with the first securing member to cause the securing aperture to disengage the first securing member and disconnect the compute module cartridge from the display stand.

20 Claims, 38 Drawing Sheets

(56) References Cited

U.S. PATENT DOCUMENTS

2017/0329364 A1\* 11/2017 Kim ........................ F16M 11/10
2018/0307266 A1\* 10/2018 Gu .......................... G06F 1/181
2019/0261525 A1\* 8/2019 Chiu .................... H05K 5/0234

\* cited by examiner

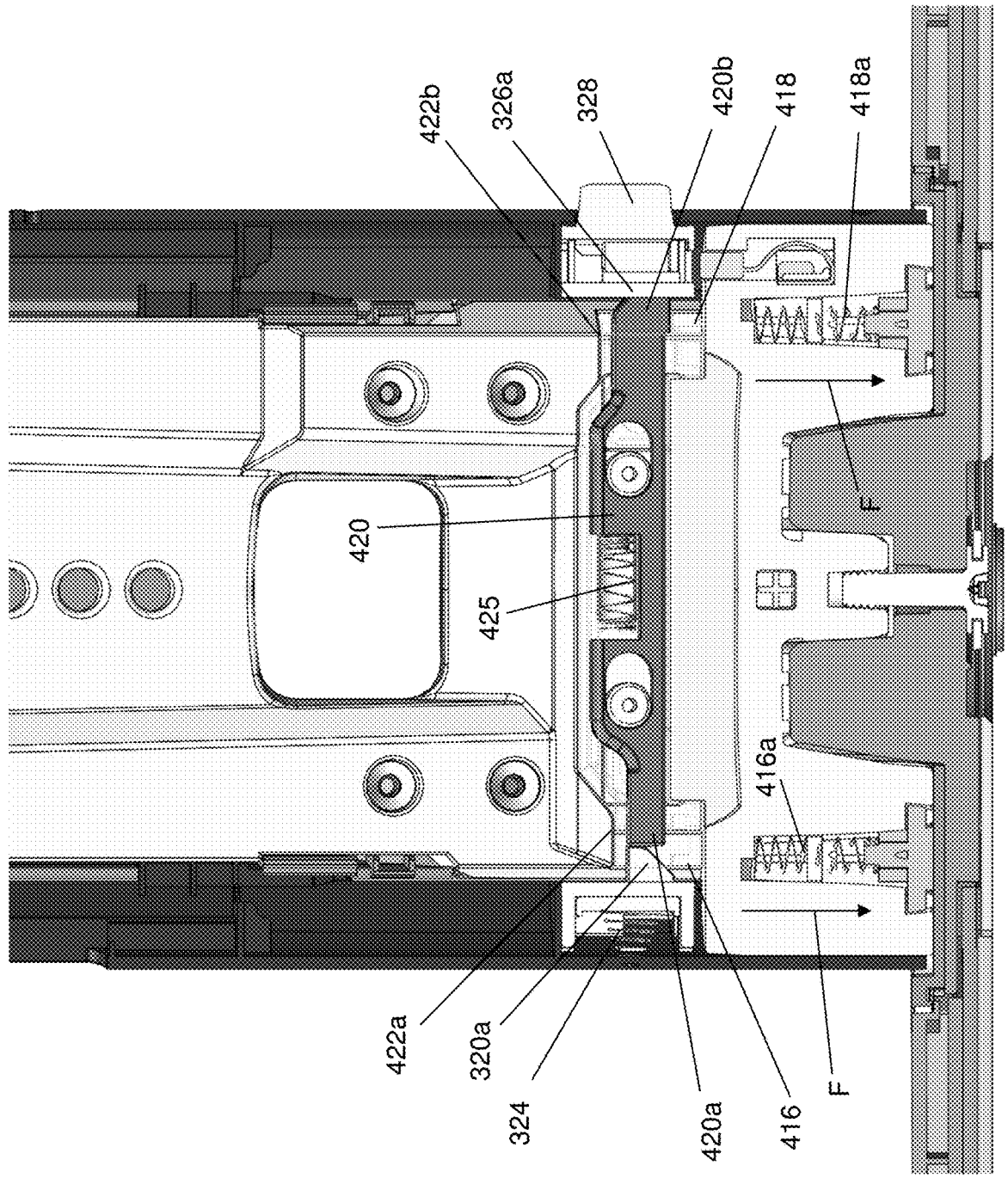

CARTRIDGE-BASED COMPUTING SYSTEM

CROSS-REFERENCE TO RELATED APPLICATIONS

The present disclosure is a continuation of U.S. patent application Ser. No. 16/946,641, filed Jun. 30, 2020, the disclosure of which is incorporated by reference herein in its entirety.

BACKGROUND

The present disclosure relates generally to information handling systems, and more particularly information handling system families utilizing information handling systems cartridges to couple the information handling system to components.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A growing trend in information handling systems such as, for example, desktop computing devices, is to provide those desktop computing devices in an "all-in-one" configuration that reduces the amount of space/volume occupied by that desktop computing device. For example, "all-in-one" desktop computing devices included in the OPTIPLEX® family of computing devices available from DELL® Inc. of Round Rock, Texas, United States, utilize a compute module that may be "hidden in plain sight" while providing a minimal footprint by connecting that compute module to a display stand that supports a display utilized with the compute module. However, conventional "all-in-one" desktop computing devices require any display stand that is provided for use as part of the "all-in-one" desktop computing devices to be configured to connect to a particular compute module that is provided for use with the display stand as part of the "all-in-one" desktop computing device. As such, conventional "all-in-one" desktop computing device families are accompanied by relatively high costs, particular when different display stands are provided for use with any particular "all-in-one" desktop computing device family, as each of those different display stands may require different features for connecting to a compute module that is provided with its "all-in-one" desktop computing device family.

Accordingly, it would be desirable to provide a cartridge-based compute module that simulates an all-in-one computing experience while addressing the issues discussed above.

SUMMARY

According to one embodiment, an Information Handling System (IHS) includes a compute module cartridge including a first display stand securing member, a second display stand securing member that is located opposite the compute module cartridge from the first display stand securing member, and a release member that is coupled to the second display stand securing member; a compute module that is housed in the compute module cartridge and that includes: a processing system; and a memory system that is coupled to the processing system and that includes instructions that, when executed by the processing system, cause the processing system to provide computing operations; and a display stand that is configured to connect to the compute module cartridge, wherein the display stand includes: a securing aperture that is defined by the display stand and that is configured to engage the first display stand securing member when the compute module cartridge is connected to the display stand; and a securing element that is configured to be engaged by the first display stand securing member when the compute module cartridge is connected to the display stand in order to move the securing element in a first direction relative to the display stand and into engagement with the second display stand securing member on the compute module cartridge, wherein the securing element is configured to be engaged by the release member on the compute module cartridge to move the securing element in a second direction that is opposite the first direction and cause the securing element to: disengage the second display stand securing member; and engage the first display stand securing member to cause the securing aperture to disengage the first display stand securing member.

BRIEF DESCRIPTION OF THE DRAWINGS

FIG. 7C is a front view illustrating an embodiment of the compute module cartridge of FIGS. 3A and 3B being coupled to the display stand of FIGS. 4A-4G.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
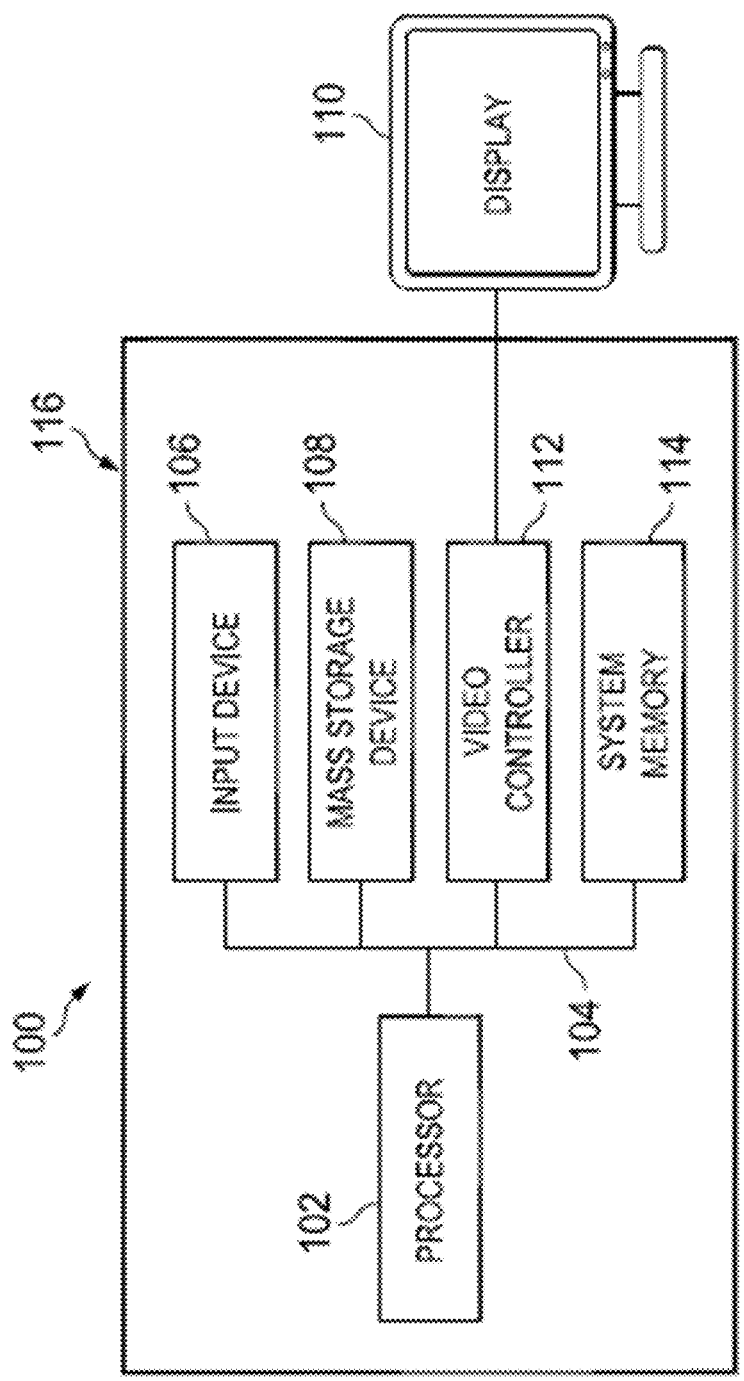
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
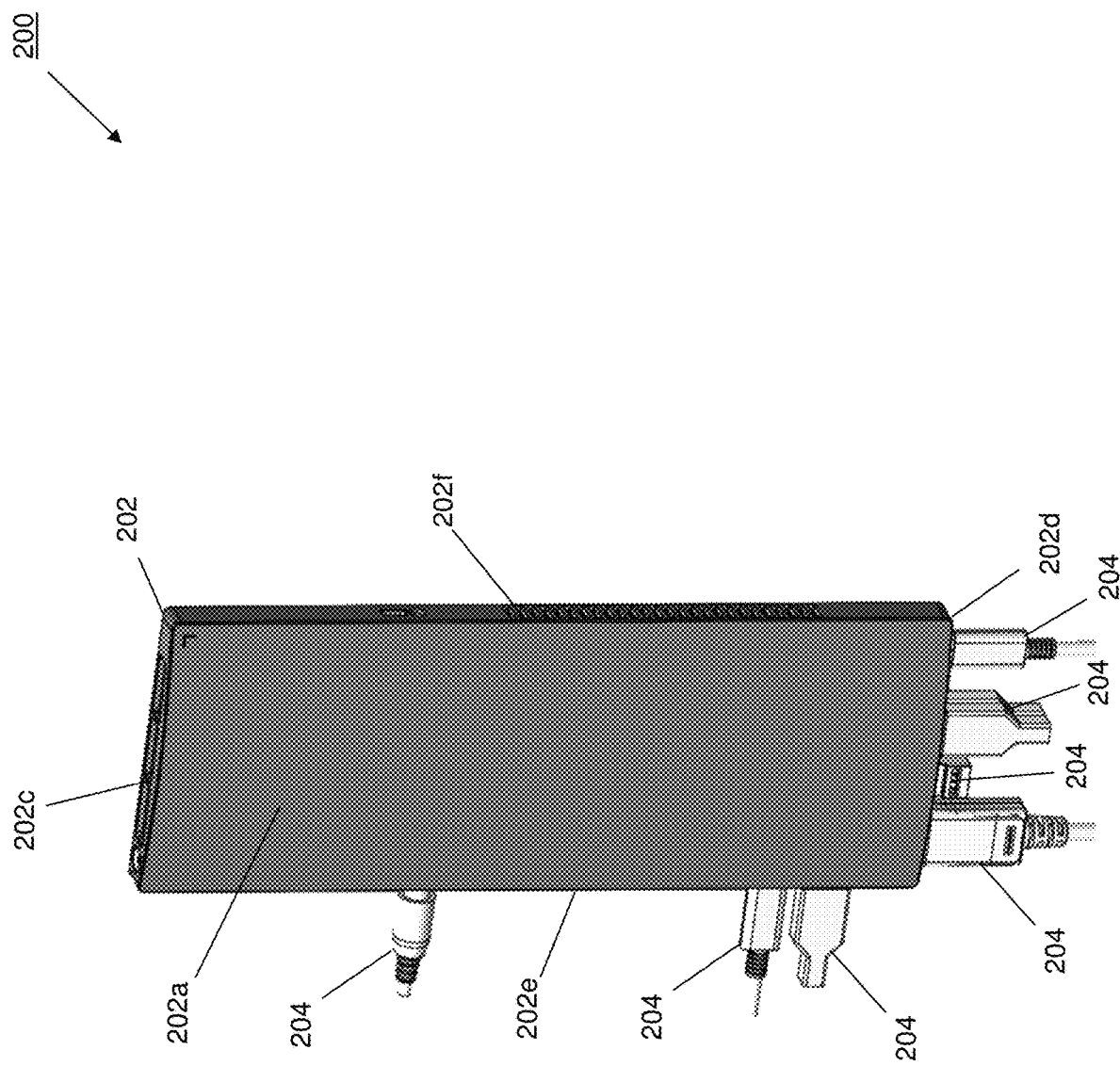
FIG. 2A is a front perspective view illustrating an embodiment of a compute module that may be utilized in the cartridge-based computing system of the present disclosure.
Figure 2B:
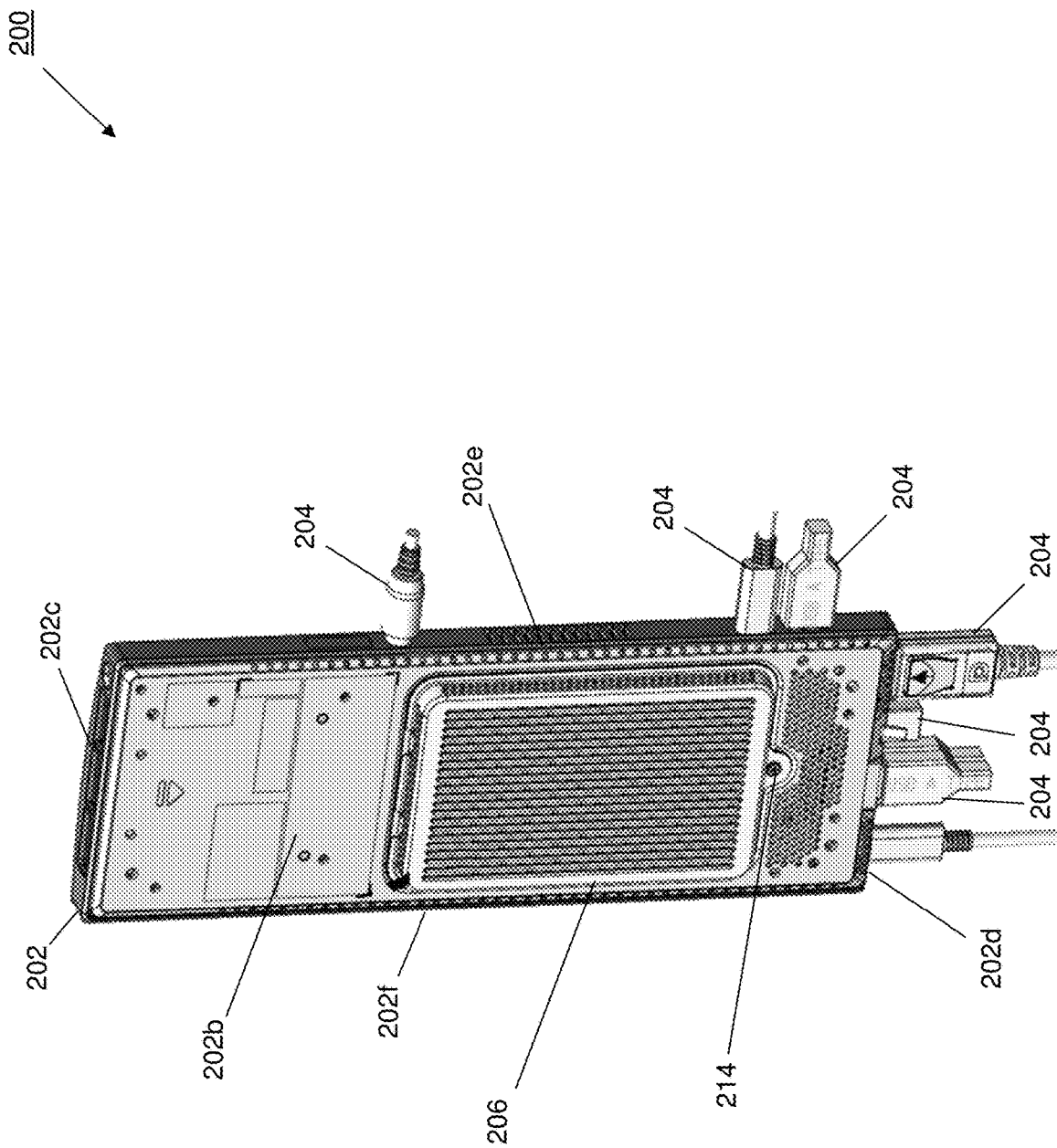
FIG. 2B is a rear perspective view illustrating an embodiment of the compute module of FIG. 2A.

Referring now to FIGS. 2A and 2B, an embodiment of a compute module 200 is illustrated that may be utilized in the cartridge-based computing system of the present disclosure. In the illustrated embodiment and the examples below, the compute module 200 may be a compute module provided in a desktop computing device such as those included in the OPTIPLEX® family of desktop computing devices available from DELL® Inc. of Round Rock, Texas, United States. For example, the compute module 200 may be provided by the IHS 100 discussed above with reference to FIG. 1, and/or may include some or all of the components of the IHS 100. In the illustrated embodiment, the compute module 200 includes a chassis 202 that defines a chassis housing that houses the components of the compute module 200, which one of skill in the art in possession of the present disclosure will recognize may include processing systems, memory systems (e.g., that include instructions that, when executed by the processing system, cause the processing system to perform a variety of computing operations known in the art), storage systems, communication systems, and/or any other computing components known in the art. In many embodiments, the compute module 200 provides a "standalone", Electro-Magnetic Interference (EMI)-certified computing system that may be attached to computing components (e.g., input devices, displays, etc.) using only the cabling 204 (e.g., all electrical power and data connections may be made using the cabling 204 and without the need for any external circuit boards) in order to perform computing operations without being connected to the display stands and/or mounting solutions discussed below, and thus one of skill in the art in possession of the present disclosure will appreciate that the compute module 200 may be provided in a desktop drawer, cabinet, or other housing (e.g., rather than the display stands or mounting solutions discussed below) and connected to a display and input device to provide a fully functioning desktop computer.

The chassis 202 includes a front surface 202a, a rear surface 202b that is located opposite the chassis 202 from the front surface 202a, a top edge 202c extending from the front surface 202a and the rear surface 202b, a bottom edge 202d that is located opposite the chassis 202 from the top edge 202c and that extends between the front surface 202a and the rear surface 202b, and a pair of opposing side edges 202e and 202f that are located opposite the chassis 202 from each other and that extend between the front surface 202a, the rear surface 202b, the top edge 202c, and the bottom edge 202d. As illustrated, the chassis 202 may include airflow apertures on any or all of the front surface 202a, the top edge 202c, the bottom edge 202d, and/or the side edges 202e and 202f, which one of skill in the art in possession of the present disclosure will recognize may allow an airflow adjacent the front surface 202a and/or those edges 202c, 202d, 202e, and/or 202f to enter the chassis housing defined by the chassis 202 in order to cool the components housed in the chassis housing.

Furthermore, the chassis 202 may also include connectors on any or all of the front surface 202a, the rear surface 202b, the top edge 202c, the bottom edge 202d, and/or the side edges 202e and 202f that are configured to connect to cabling 204 that couples the compute module 200 to other computing components as discussed in further detail below. In the illustrated embodiment, a heat dissipation cover 206 is coupled to the rear surface 202b of the chassis 202, and may provide the heat dissipation cover system described by some of the inventors of the present disclosure in U.S. patent application Ser. No. 16/946,643, filed on Jun. 30, 2020, the disclosure of which is incorporated by reference herein in its entirety. However, while a specific compute module 200 is illustrated and described below, one of skill in the art in possession of the present disclosure will recognize that the teachings of the present disclosure may be utilized with other compute modules while remaining within the scope of the present disclosure as well.

Referring now to FIGS. 3A, 3B, 3C, 3D, 3E, 3F, and 3G, embodiments of a compute module cartridge 300 are illustrated that, as discussed below, operates to house the compute module 200 in the cartridge-based computing system of the present disclosure, while also being configured to couple to any of a variety of display stands that are provided for one or more cartridge-based computing system families. In the illustrated embodiment, the compute module cartridge 300 includes a base 302 having a front wall 302a, a pair of side walls 302b and 302c that extend from opposite sides of the front wall 302a in a "curved" or "wrap-around" orientation that is discussed in further detail below, a top edge 302d of the front wall 302a and the side walls 302b/302c, and a bottom edge 302e of the front wall 302a and the side walls 302b/302c that is located opposite the base 302 from the top edge 302d. Furthermore, the front wall 302a and the side walls 302b and 302c define a compute module housing 304 between them. In the illustrated embodiment, a low-friction surface 305 of the compute module cartridge 300 is located adjacent the compute module housing 304 and may be configured to prevent aesthetic damage (e.g., scratching) of the outer surface of the compute module 200 during the coupling of the compute module cartridge 300 to the compute module 200. While not called out in the figures with element numbers, one of skill in the art in possession of the present disclosure will recognize how the front wall 302a and/or side walls 302b and 302c may include alignment and coupling features that are configured to engage the compute module 200 and display stands discussed below in order to align and couple the compute module cartridge 300 to the compute module 200 and those display stands.

Figure 3A:
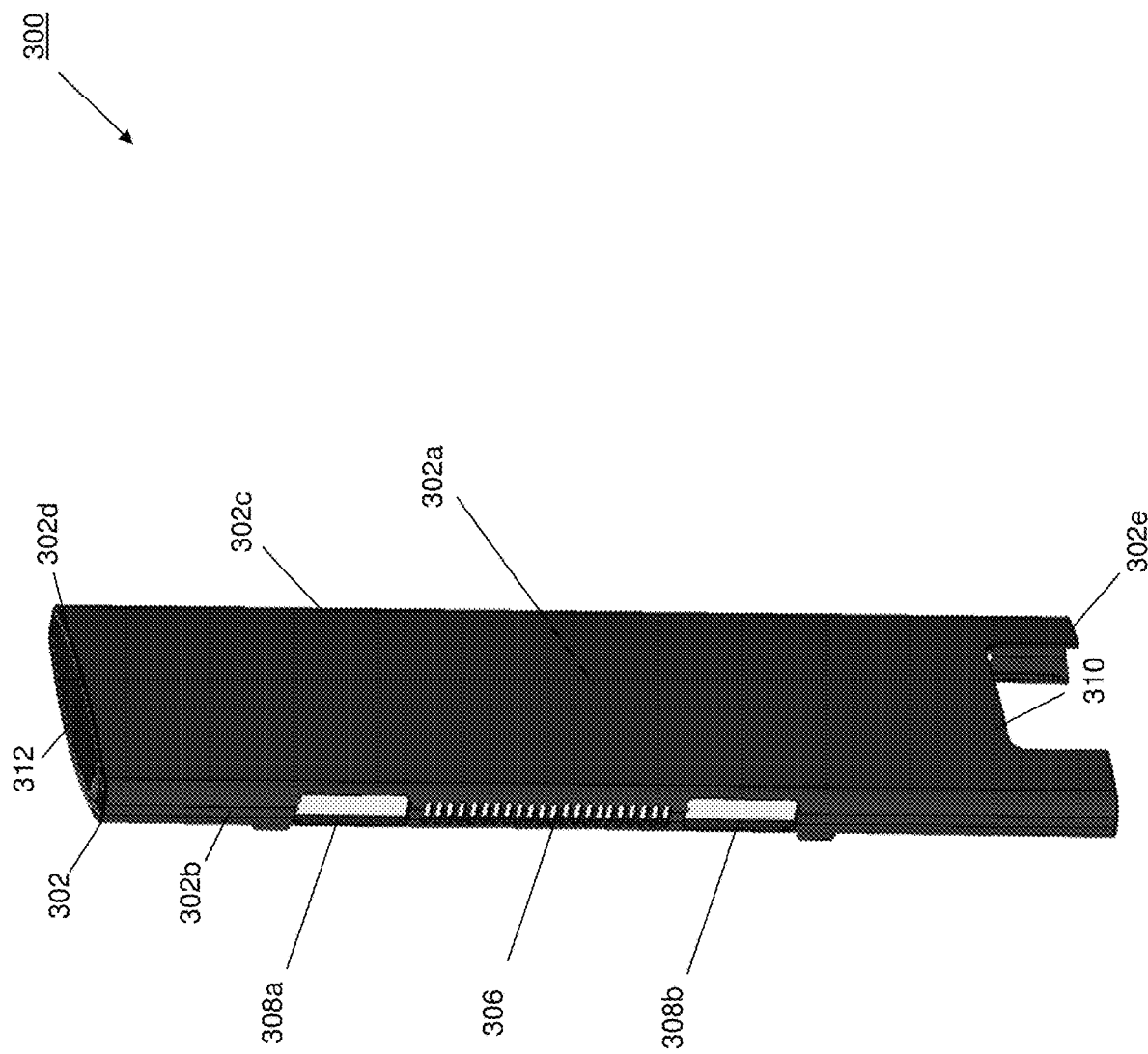
FIG. 3A is a front perspective view illustrating an embodiment of a compute module cartridge that may be utilized in the cartridge-based computing system of the present disclosure.
Figure 3B:
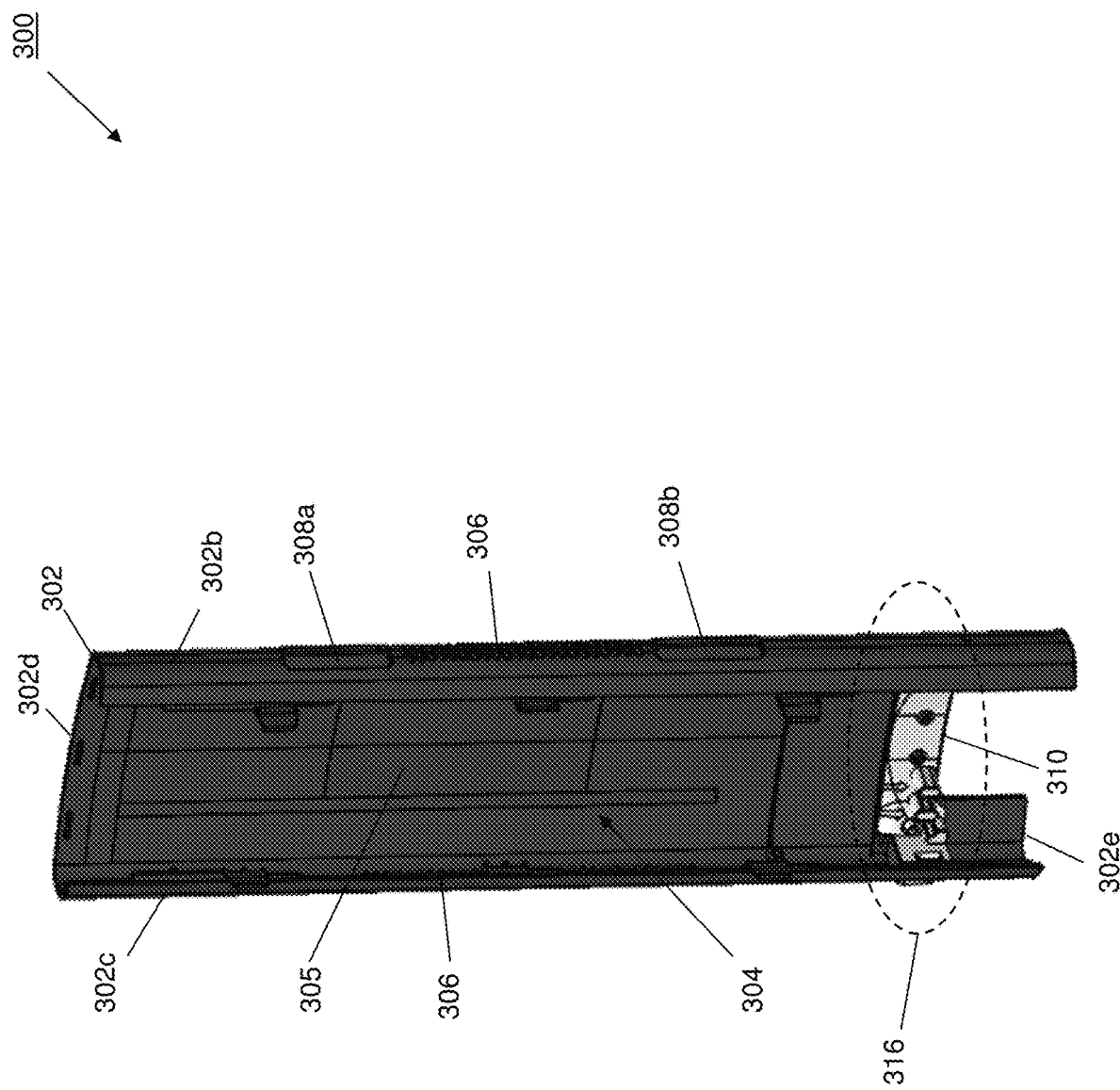
FIG. 3B is a rear perspective view illustrating an embodiment of the compute module cartridge of FIG. 3A.
Figure 3C:
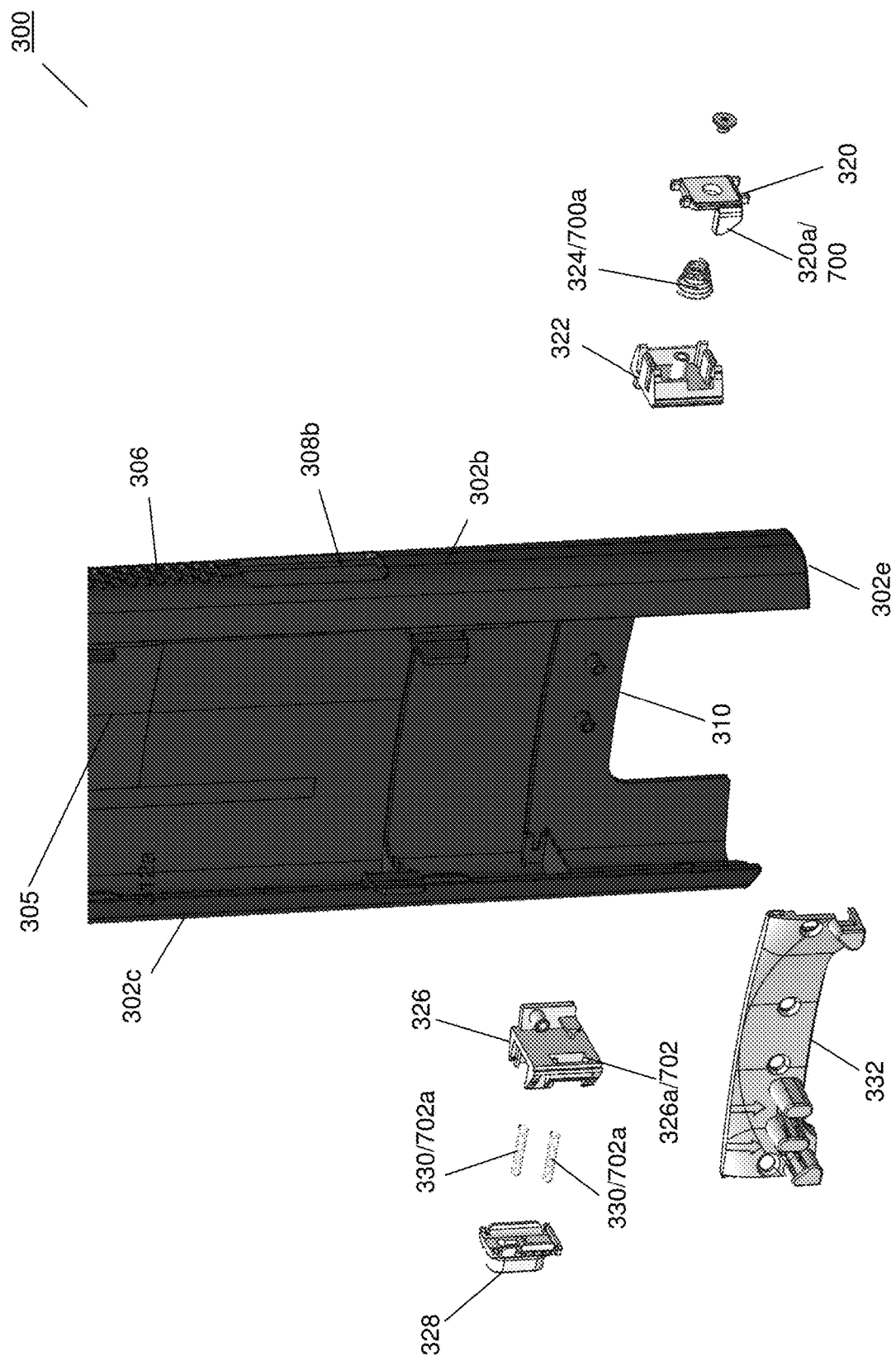
FIG. 3C is an exploded perspective view illustrating an embodiment of the compute module cartridge of FIGS. 3A and 3B.
Figure 3D:
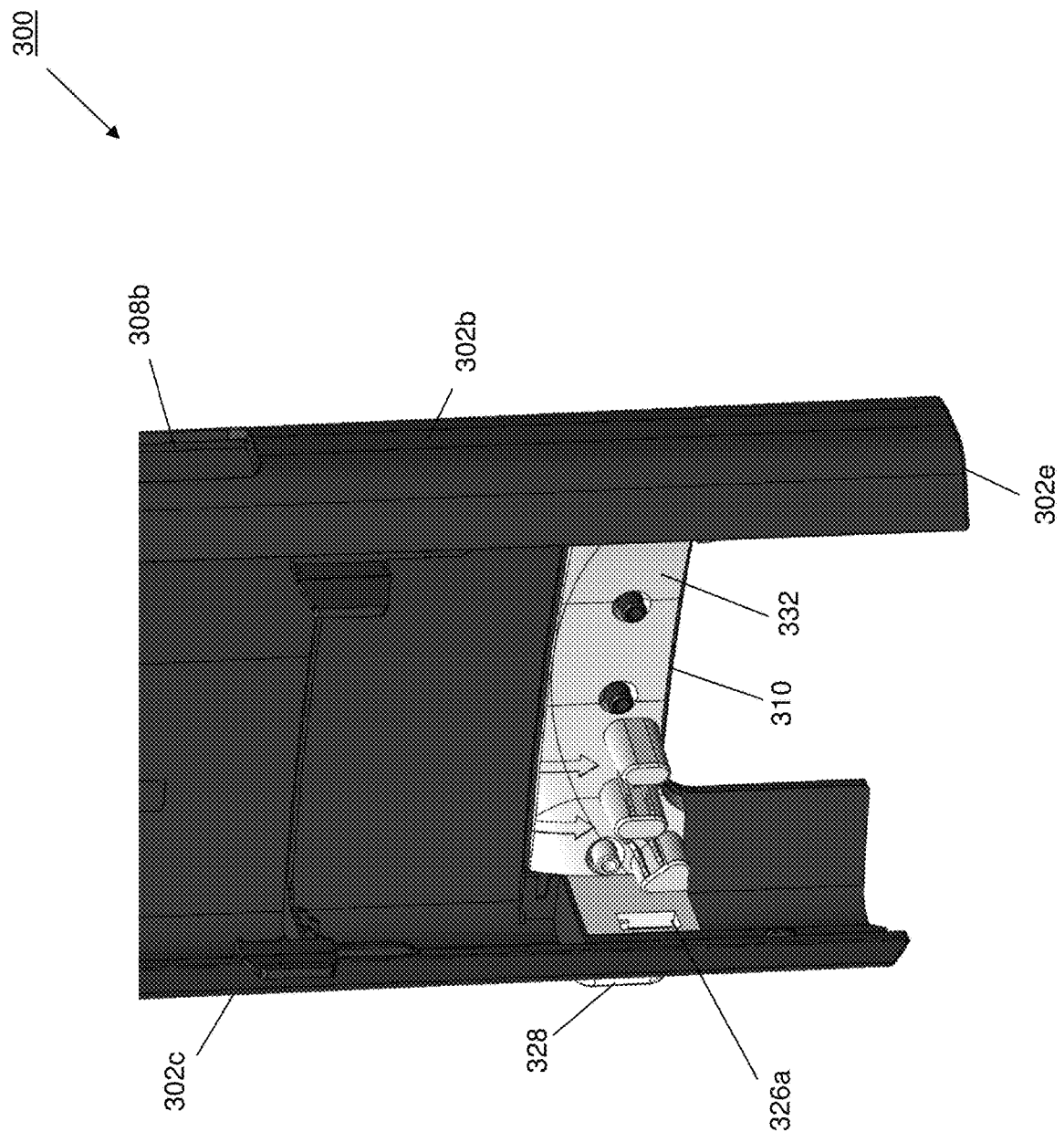
FIG. 3D is a \ rear perspective view illustrating an embodiment of the compute module cartridge of FIGS. 3A and 3B.
Figure 3E:
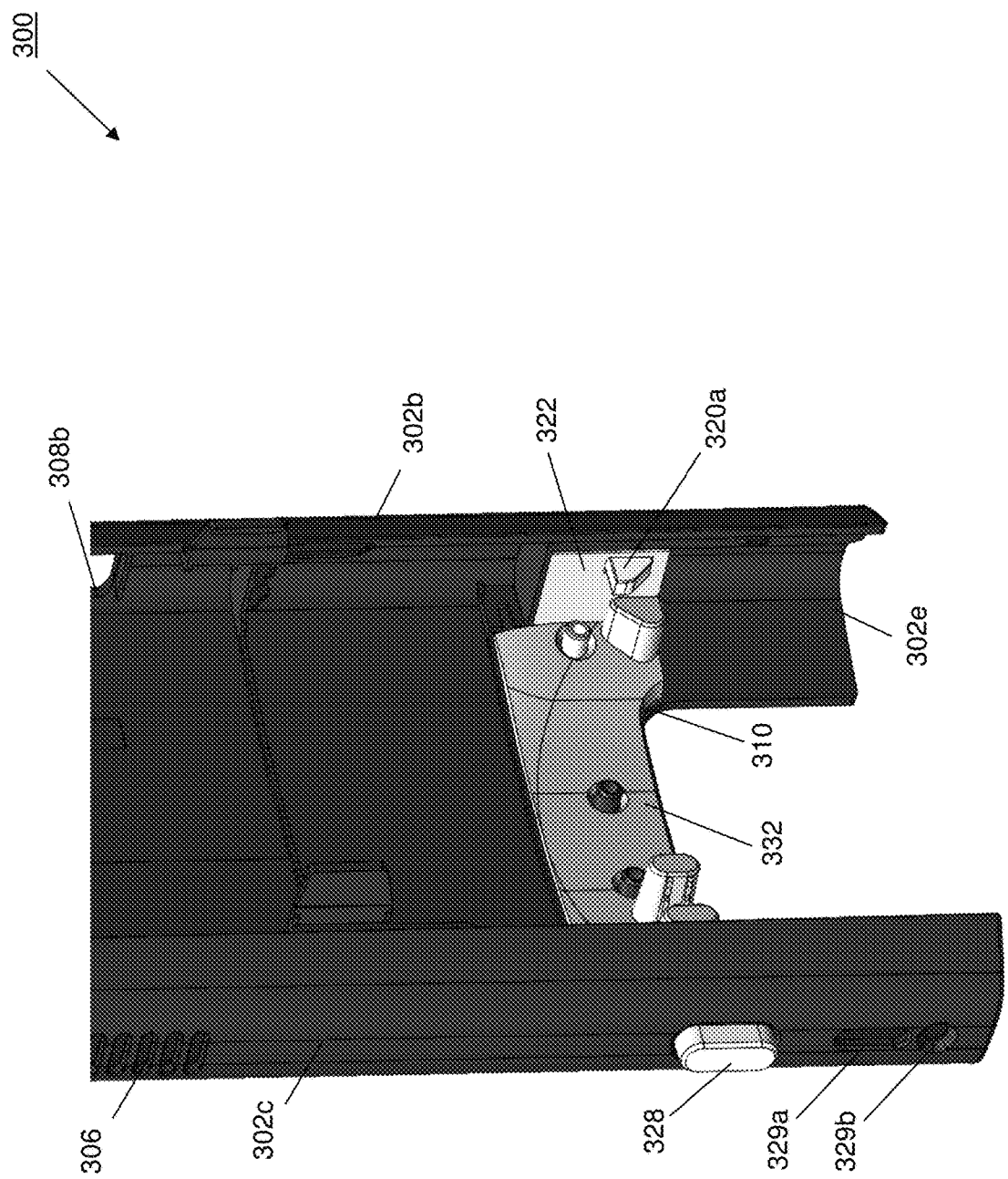
FIG. 3E is a \ rear perspective view illustrating an embodiment of the compute module cartridge of FIGS. 3A and 3B.

As illustrated, a plurality of airflow apertures 306 are defined by the side wall 302b and 302c and may be configured to align with airflow apertures on the compute module 200 when the compute module 200 is housed in the compute module cartridge 300. Furthermore, FIG. 3A illustrates how a plurality of connector apertures 308a and 308b are defined by the side wall 302b and may be configured to align with connectors on the compute module 200 when the compute module 200 is housed in the compute module cartridge 300 (e.g., in order to allow the cabling 204 to connect to the compute module 200 through those connector apertures), and one of skill in the art in possession of the present disclosure will recognize how the front wall 302a, and/or the side wall 302c may define similar connector apertures as well. A cable routing channel 310 is defined by the base wall 302 and extends into the base wall 302 from the bottom edge 302e, and may be configured to align with connectors on the compute module 200 when the compute module 200 is housed in the compute module cartridge 300 (e.g., in order to allow the cabling 204 to connect to the compute module 200 and the cables on that cabling 204 to be routed as discussed in further detail below.) As will be appreciated by one of skill in the art in possession of the present disclosure, the compute module cartridge 300 may be configured so as to not interfere with communications signals (e.g., BLUETOOTH® wireless signals, WIFI wireless signals, etc.) provided by communications systems in the compute module 300.

Figure 3F:
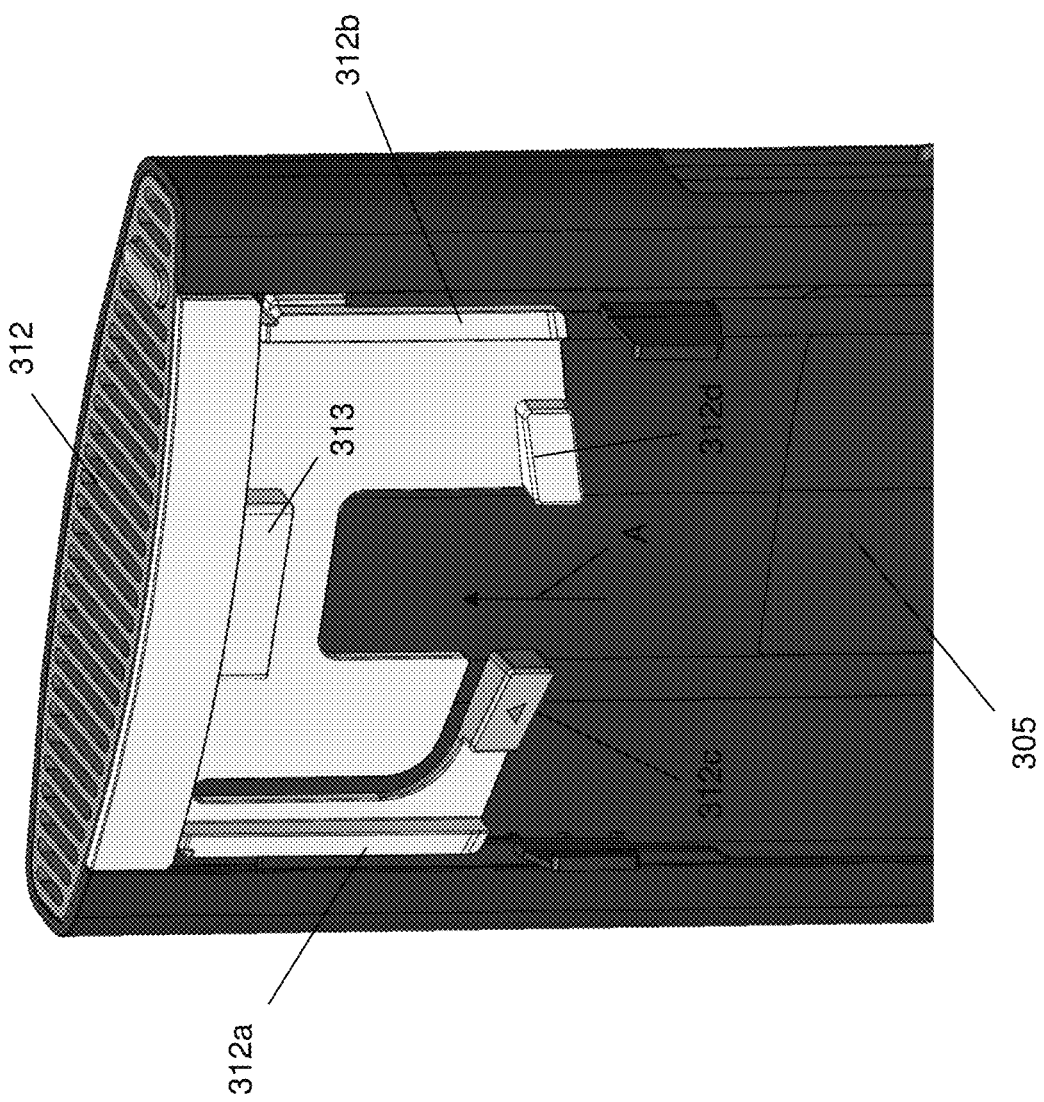
FIG. 3F is a rear perspective view illustrating an embodiment of a cartridge cap on the compute module cartridge of FIGS. 3A and 3B.

As illustrated in FIGS. 3A and 3F, the compute module cartridge 300 may include a cartridge cap 312 that is configured to be coupled to the compute module cartridge 300 adjacent its top edge 302d, and the cartridge cap 312 may include a release subsystem having a coupling arms 312a and 312b that are configured to engage coupling features on the compute module cartridge 300 (e.g., located adjacent the compute module housing 304) in order to connect the cartridge cap 312 to the compute module cartridge 300. Furthermore, the coupling arm 314a includes release elements 312c and 312d that may be actuated by a user by moving the release element 312c in a direction A to disengage the coupling arm 312a and the coupling features on the compute module cartridge 300 in order to allow the cartridge cap 312 to be de-coupled from the compute module cartridge 300. Furthermore, the cartridge cap 312 also includes a securing element 313 that is configured to engage a display stand to secure the cartridge cap 312 to that display stand. However, while a specific cartridge cap 312 is illustrated in FIGS. 3A and 3F and described below, one of skill in the art in possession of the present disclosure will appreciate that a variety of different cartridge caps may be provided with the compute module cartridge 300 of the present disclosure while remaining within its scope.

Figure 3G:
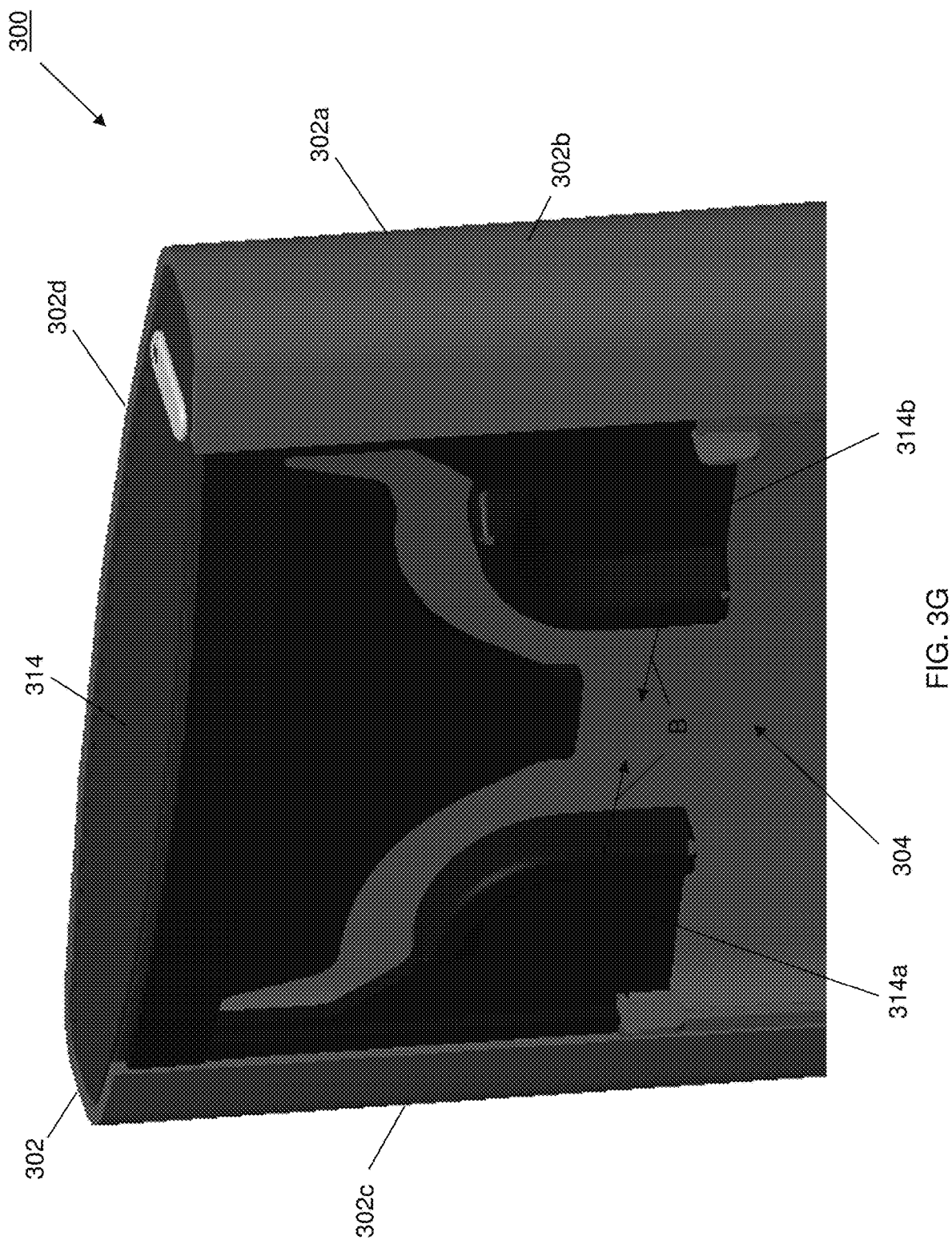
FIG. 3G is a rear perspective view illustrating an embodiment of an alternate cartridge cap on the compute module cartridge of FIGS. 3A and 3B.

For example, FIG. 3G illustrates an alternative cartridge cap 314 that may replace the cartridge cap 312 discussed above, and that cartridge cap 314 includes a pair of coupling arms 314a and 314b that, as discussed below, are configured to engage coupling features on the compute module cartridge 300 (e.g., located adjacent the compute module housing 304) in order to connect the cartridge cap 314 to the compute module cartridge 300. As will be appreciated by one of skill in the art in possession of the present disclosure, the coupling arm 314a and 314b may be actuated by a user by moving the coupling arms 314a and 314b towards each other (as indicated by the elements B in FIG. 3G) to disengage the coupling arms 314a and 314b and the coupling features on the compute module cartridge 300 in order to allow the cartridge cap 314 to be de-coupled from the compute module cartridge 300.

With reference to FIGS. 3B, 3C, 3D, and 3E, a display stand coupling subsystem 316 may be provided on the compute module cartridge 300, and in the illustrated embodiment includes a mounting bracket 320 including a first display stand securing member 320a, with the mounting bracket 320 mounted to a base piece 322 by a biasing member 324 that biases the first display stand securing member 320a into the compute module housing 304. In the illustrated embodiment, the display stand coupling subsystem 316 also includes a mounting bracket 326 that defines a second display stand securing member 326a, and a release member 328 that is coupled to the second display stand securing member 326a and that is biased by a pair of biasing members 330 away from the second display stand securing member 326a. A locking aperture 329a (e.g., configured for the locking device discussed below) and a locking aperture 329b (e.g., configured for a locking screw, not illustrated herein) are defined by the side wall 302c adjacent the release member 328. Furthermore, a cable routing element 332 is coupled to the compute module cartridge 300 adjacent the cable routing channel 310. However, one of skill in the art in possession of the present disclosure will appreciate that display stand coupling subsystems that provide the functionality of the display stand coupling subsystem 316 discussed below may be provided with a variety of different components while remaining within the scope of the present disclosure as well. Thus, while a specific compute module cartridge 300 is illustrated and described below, one of skill in the art in possession of the present disclosure will recognize that compute module cartridges provided according to the teachings of the present disclosure may include a variety of components and/or component configurations while remaining within the scope of the present disclosure as well.

Referring now to FIGS. 4A, 4B, 4C, 4D, 4E, 4F, and 4G, embodiments of a display stand 400 are illustrated that, as discussed below, operates to connect to the compute module cartridge 300 in the cartridge-based computing system of the present disclosure, while also being configured to support a display. In the illustrated embodiment, the display stand 400 includes a base 402 that is configured to be positioned on a surface (e.g., a desktop). A support member 404 extends from the base 402, and includes a bottom edge 404a that engages the base 402, a top edge 404b that is located opposite the support member 404 from the bottom edge 404a, a front surface 404c that extends between the bottom edge 404a and the top edge 404b, a rear surface 404d that is located opposite the support member 404 from the front surface 404c and that extends between the bottom edge 404a and the top edge 404b, and a pair of side edges 404e and 404f that are located opposite each other on the support member 404 and that each extend between the bottom edge 404a, the top edge 404b, the front surface 404c, and the rear surface 404d. While not called out in the figures with element numbers, one of skill in the art in possession of the present disclosure will recognize how the front surface 404c and/or side surfaces 404e and 404f of the display stand 400 may include alignment and coupling features (e.g., with some of those features visible in FIG. 4C) that are configured to engage the compute module cartridge 300 in order to align and couple the compute module cartridge 300 to the support member 404 on the display stand 400.

As illustrated, a cable routing surface 406 may be included on the front surface 404c of the support member 404 adjacent the bottom edge 404a of the support member 404, and may be configured to align with cabling 204 on the compute module 200 when the compute module 200 is coupled to the display stand 400 via the compute module cartridge 300 (e.g., in order to allow the cables on that cabling 204 to be routed as discussed in further detail below.) As will be appreciated by one of skill in the art in possession of the present disclosure, the curved/radially ramped surface of the cable routing surface 406 may provide more room for routing cabling 204 extending from the compute module 200 in the compute module cartridge 300 when the compute module cartridge 300 is connected to the support member 404, and when the cartridge 300 including the compute module 200 with cables 204 is attached to the display stand 400, the curved surface 406 also allows the cabling 204 to form a curved bend-radius in the shape of the ramped surface 406, which operates to reduce stress on the cables 204 and interference between the cables 204, the stand 400, and the compute module cartridge 300, ensuring the cables 204 exit the back of the stand 400 in an organized manner and that the cartridge 300 installs properly onto the display stand 400. Furthermore, FIG. 4A also illustrated how a cable routing aperture 408 may be defined by the support member 404 and may extend through the support member 404 from its front surface 404c to its rear surface 404d in order to, for example, allow cabling (e.g., a display cable) that is coupled to the compute module 200 to be routed through the display stand 400 in order to couple to a display.

Figure 4A:
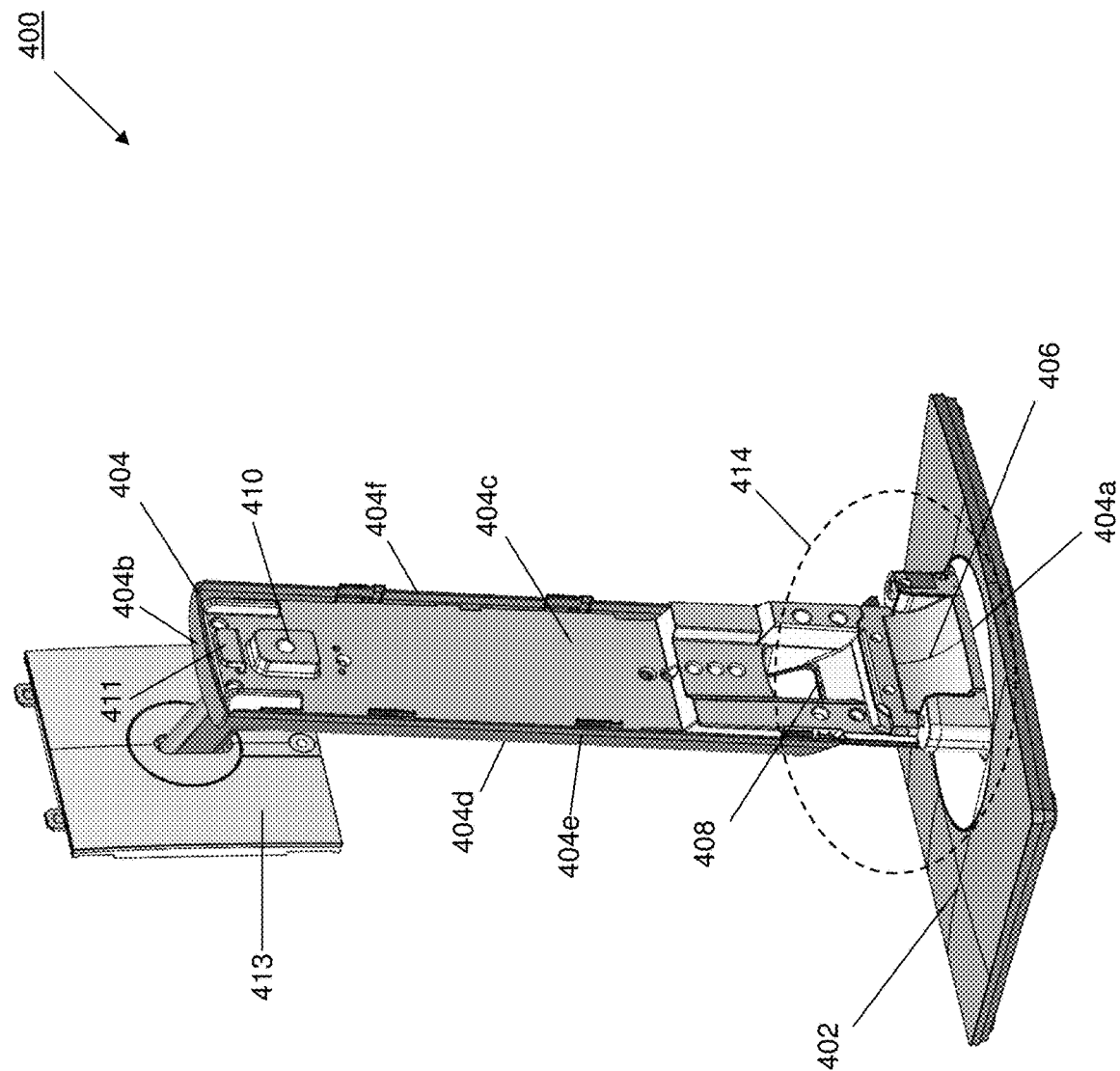
FIG. 4A is a perspective view illustrating an embodiment of a display stand that may be utilized in the cartridge-based computing system of the present disclosure.
Figure 4B:
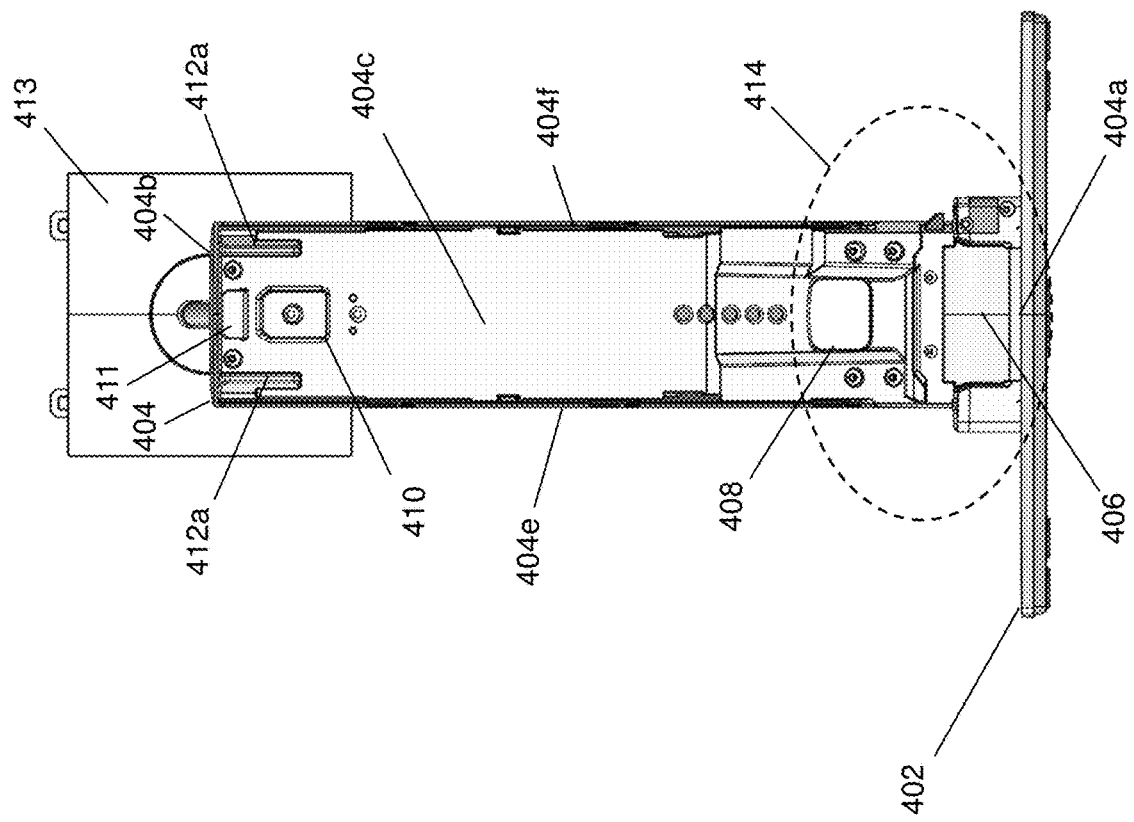
FIG. 4B is a front view illustrating an embodiment of the display stand of FIG. 4A.
Figure 4C:
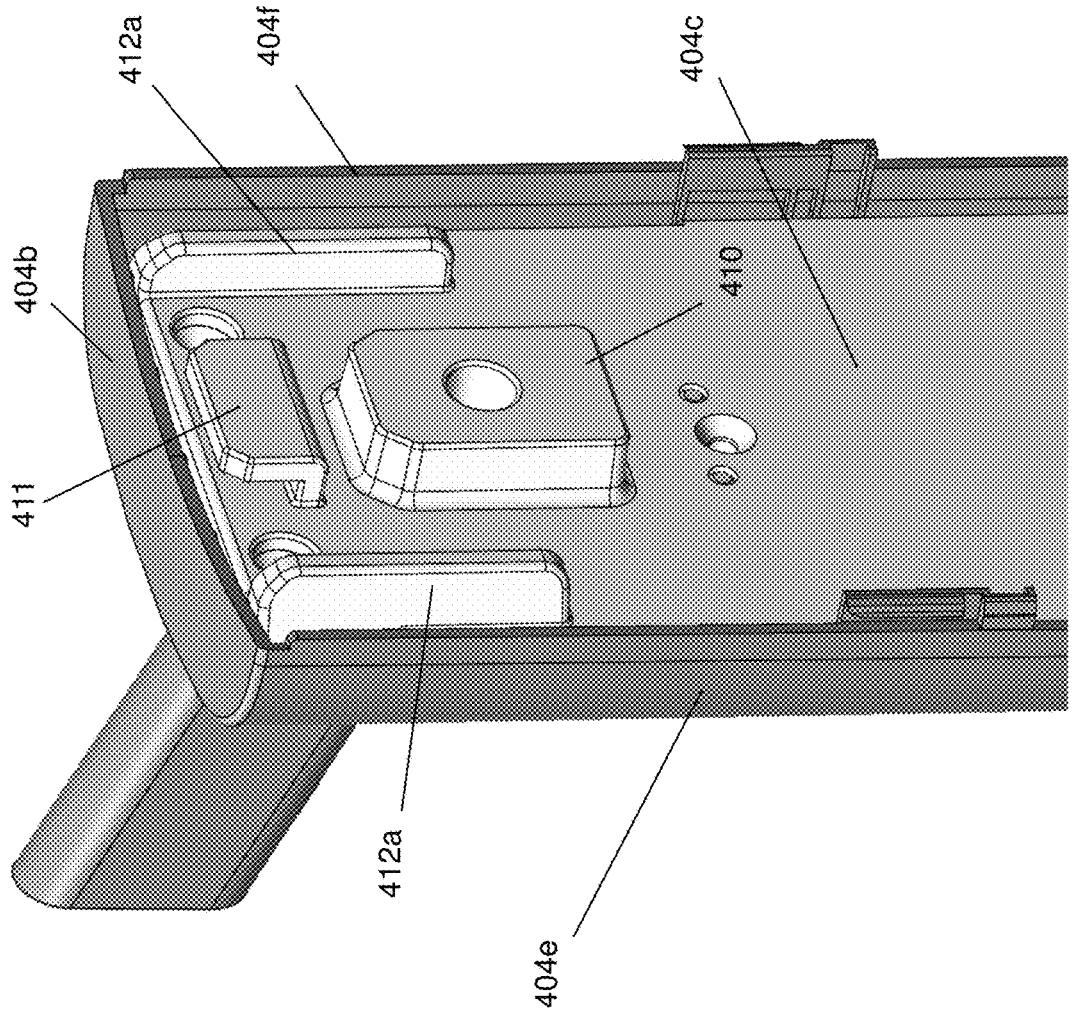
FIG. 4C is a perspective view illustrating an embodiment of a cartridge securing element included on the display stand of FIG. 4A.

The embodiments of the display stand 400 provided in FIGS. 4A-4C illustrate how a cartridge cap engagement element 410 may extend from the front surface 404c of the support member 404 and, as discussed below, may be configured to engage the coupling arms 312a and 312b on the cartridge cap 312 (or the coupling arm 314a on the cartridge cap 314) in order to prevent actuation of the coupling arms 312a and 312b (or the coupling arm 314a) and secure the cartridge cap 312 (or the cartridge cap 314) on the compute module cartridge 300, thus securing the compute module 200 in the compute module cartridge 300. A locking feature 411 extends from the front surface 404c of the support member 404 adjacent the cartridge cap engagement element 410, and is configured to engage the securing element 313 on the cartridge cap 312 to secure the cartridge cap 312 to the display stand 400. Furthermore, a plurality of guide members 412a and 412b may extend from the front surface 404c of the support member 404 on opposite sides of the cartridge cap engagement element 410, with those guide members 412a and 412b configured to align and guide the compute module cartridge 300 when the compute module cartridge 300 is coupled to the support member 404 on the display stand 400, discussed in further detail below.

A display mount 413 extends from the rear surface 404d of the support member 404 adjacent its top edge 404b and, as discussed below, is configured to mount to and support a display that may be coupled to the compute module 200 (e.g., via the cabling 204). Furthermore, FIGS. 4A and 4B illustrate how the support member 404 includes a coupling subsystem 414 that is provided on the support member 404 adjacent the bottom edge 404a, and an embodiment of that coupling subsystem 414 is illustrated in more detail in FIGS. 4D-4F (with FIGS. 4E and 4F providing some of the features illustrated in FIG. 4D as transparent in order to provide a view of the components of the coupling subsystem 414 that are obscured in FIG. 4D.)

In the illustrated embodiment, the coupling subsystem 414 includes a pair of biasing members 416 and 418 that are located within the support member 404 and that extend out of the support member 414 on opposite sides of the cable routing surface 406, with each of the biasing members 416 and 418 including a respective biasing element 416a and 416b (e.g., springs) that operate to bias the biasing members 416 and 418 out of the support member 414. As discussed below, the biasing elements 416a and 416b operate to allow the biasing members 416 and 418 to exert a consistent biasing force on the compute module cartridge 300 when the compute module cartridge is coupled to/decoupled from the support member 404 on the display stand 400, as discussed in further detail below.

In the illustrated embodiment, the coupling subsystem 414 also includes a securing element 420 that is located within and that is movably coupled the support member 404. For example, a securing element cover 422 is coupled to the support member 404 and confines the securing element 420, with the securing element 420 movably coupled to the securing element cover 422 and the support member 404. The securing element 420 includes a first end 420a that is located adjacent to (and configured to move into and out of) a securing aperture 422a that is defined by the securing element cover 422 and that extends beyond side surface 404e, and a second end 420b that is located in (and configured to extend out of) a securing aperture 422b that is defined by the securing element cover 422 and that extends beyond side surface 404f. As illustrated in FIG. 4E, a biasing element 425 (e.g., a spring) is provided with the securing element 420 and, as discussed below, may operate to bias the securing element 420 such that the first end 420a of the securing element 420 is not located in the securing aperture 422a and the second end 420b of the securing element 420 extends from the securing aperture 422b.

Figure 4D:
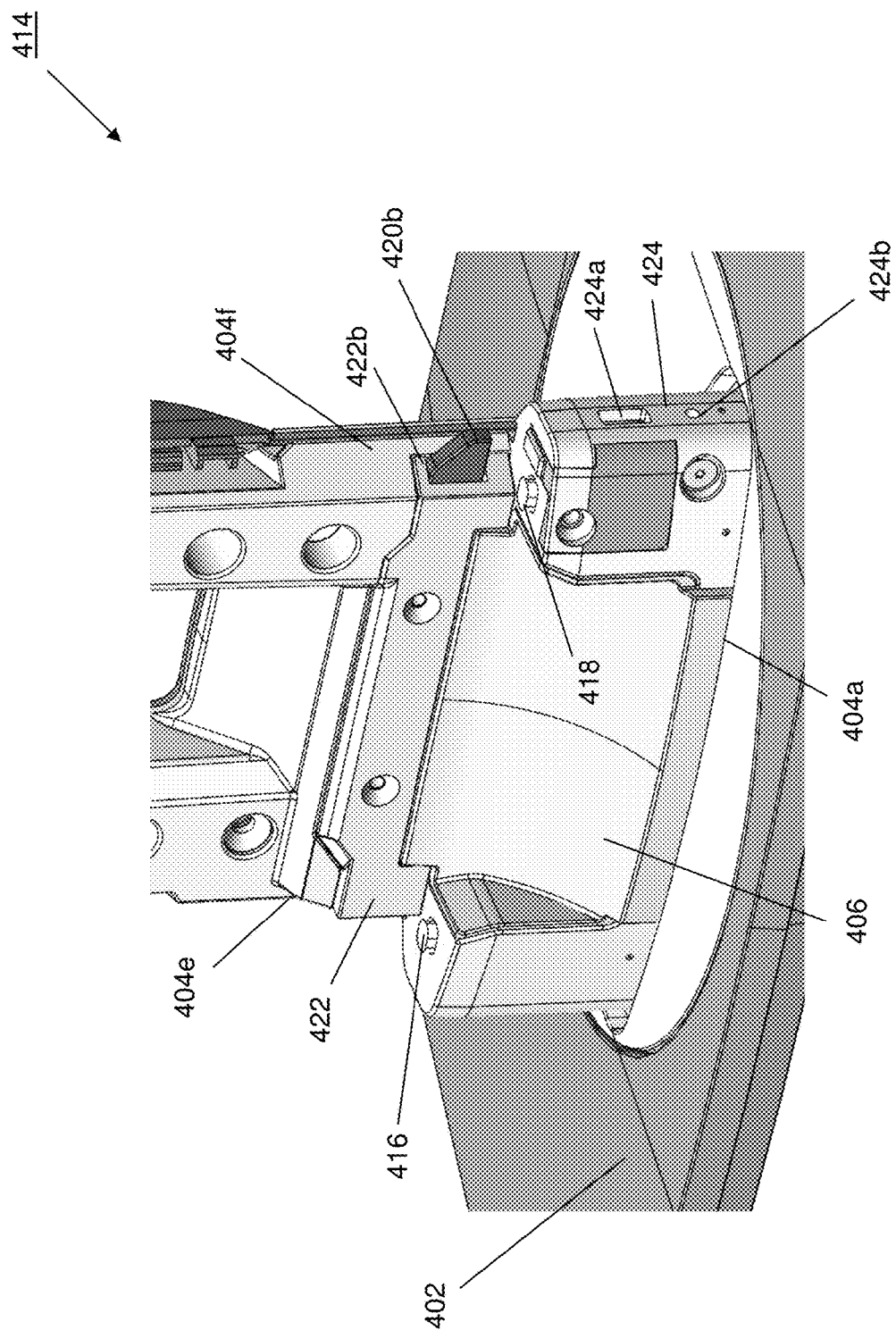
FIG. 4D is a perspective view illustrating an embodiment of a cable guide element included on the display stand of FIG. 4A.
Figure 4E:
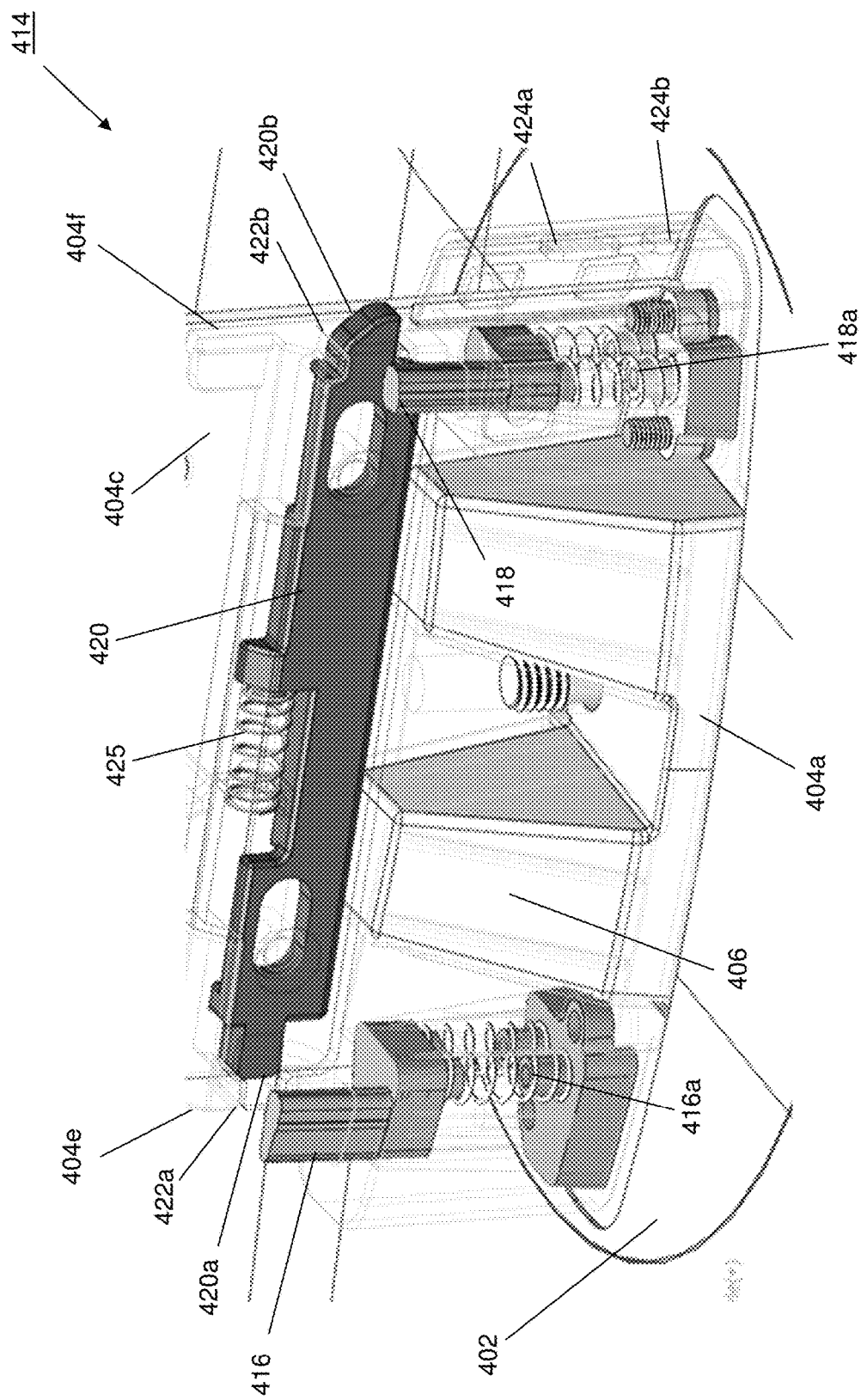
FIG. 4E is a perspective view illustrating an embodiment of ejection and locking features included on the display stand of FIG. 4A.
Figure 4F:
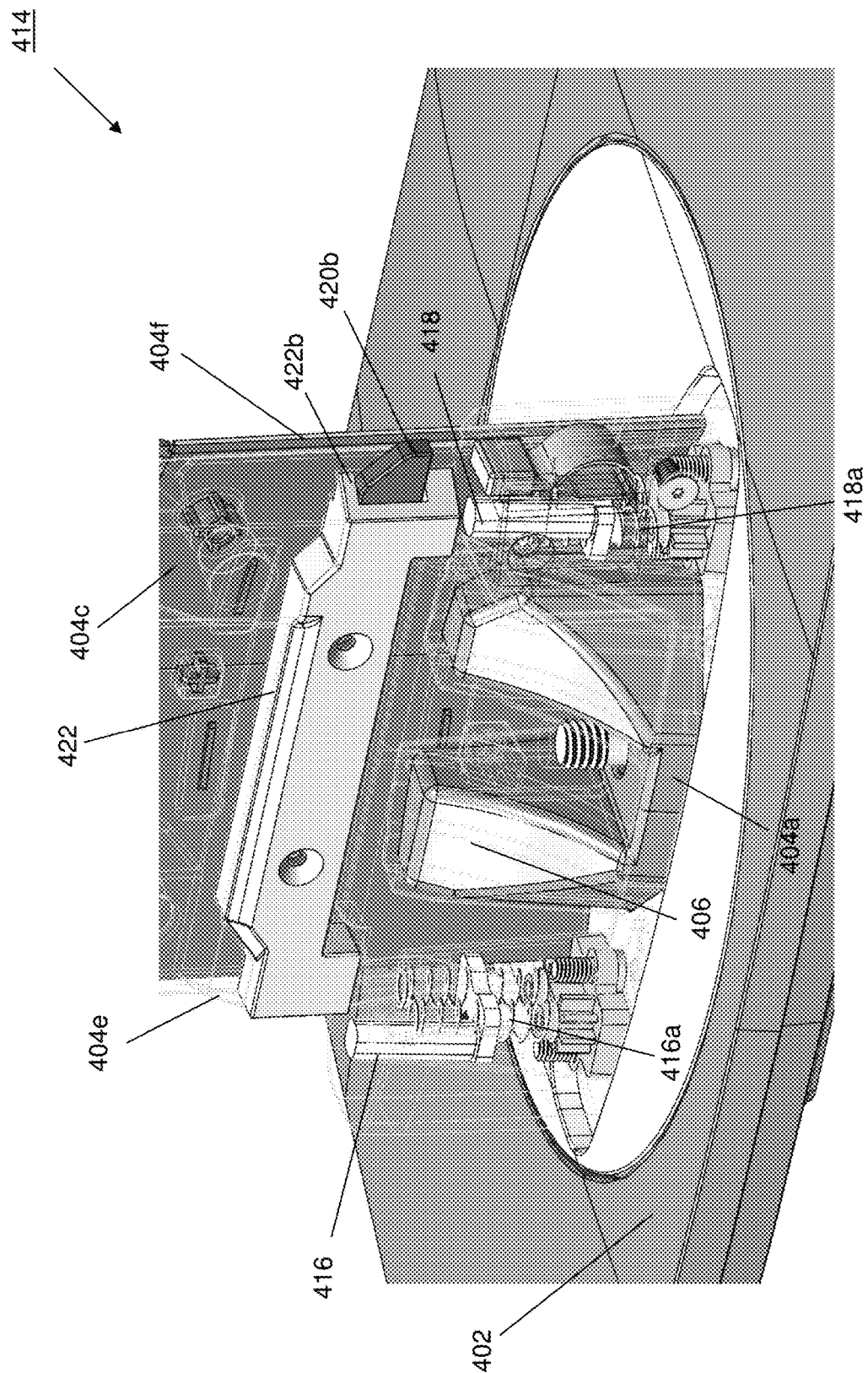
FIG. 4F is a perspective view illustrating an embodiment of a latching element included on the display stand of FIG. 4A.

As illustrated in FIG. 4D, the display stand 400 may include a locking support 424 that is mounted to the support member 404 adjacent its side surface 404f and bottom edge 404a, and that defines a locking aperture 424a that is configured to accept a locking device such as, for example, a KENSINGTON® locking device available from KENSINGTON® of San Mateo, California, United States, in order to lock the compute module cartridge 300 to the display stand 400, and a locking aperture 424b that is configured to accept a locking screw in order to lock the compute module cartridge 300 to the display stand 400, as discussed in further detail below. However, while a specific display stand 400 is illustrated and described in FIGS. 4A-4G, one of skill in the art in possession of the present disclosure will appreciate that display stands provided according to the teachings of the present disclosure may include a variety of components and/or component configurations while remaining within the scope of the present disclosure as well.

Figure 5:
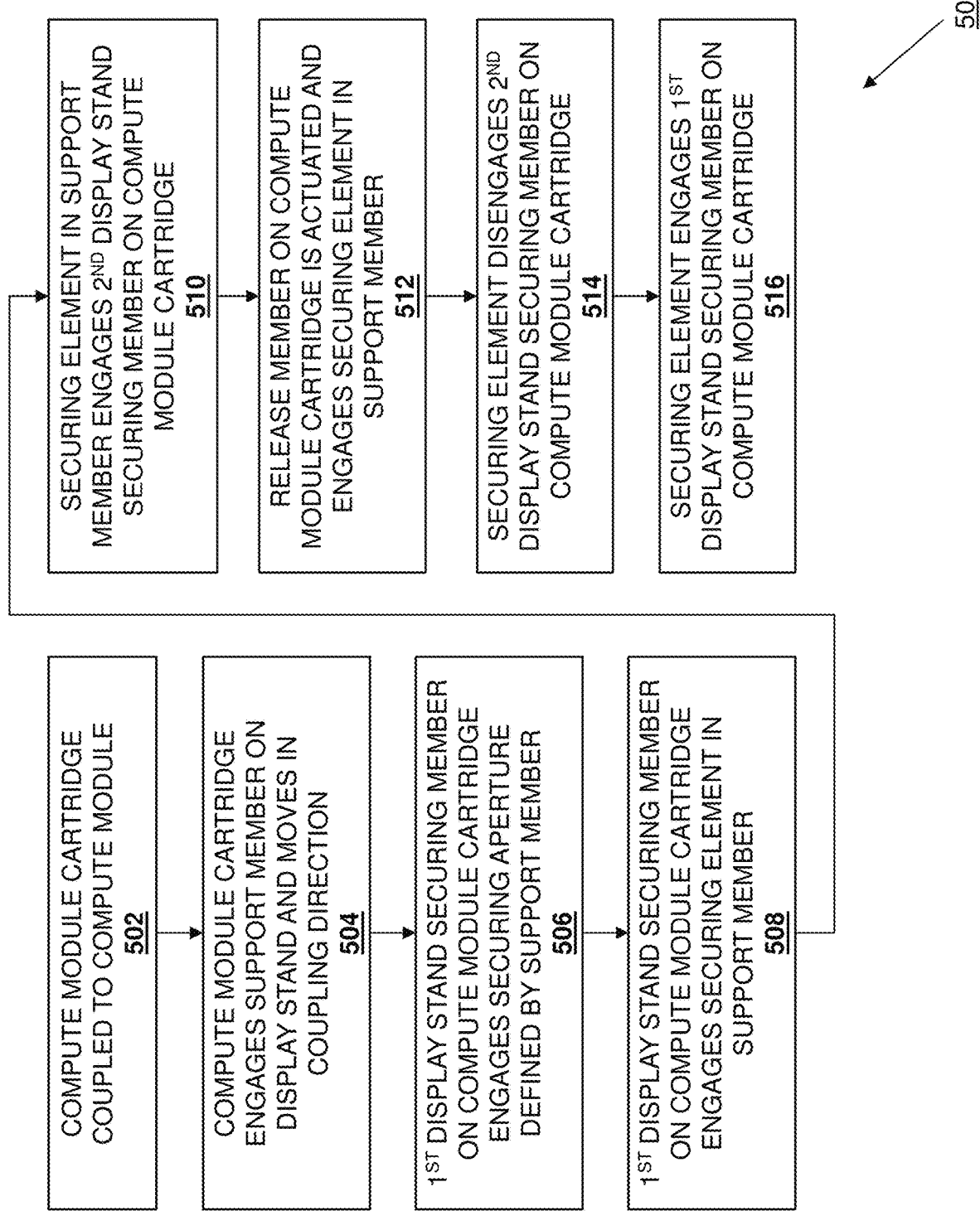
FIG. 5 is a flow chart illustrating an embodiment of a method for providing a cartridge-based computing system.

Referring now to FIG. 5, an embodiment of a method 500 for providing a cartridge-based computing system is illustrated. As discussed below, the systems and methods of the present disclosure provide a compute module cartridge that houses a compute module for an desktop computing system, and that is configured to be connected to a variety of display stands provided for a computing system family that includes that compute module. Those display stands may include coupling subsystems that provide users a common compute module cartridge coupling and removal experience, and the compute module cartridge may be configured to be to be secured to those display stands such that the compute module cannot be removed. A single cable (e.g., a type-C USB cable) may be utilized to connect the compute module to a display mounted to the display stand, with that cable transmitting data and power between the display and the compute module. The compute module and compute module cartridge also provide cable routing features for cabling connected to the compute module, which may operate to secure and route cables out of the display stand while allowing the compute module to be coupled to the compute module cartridge, and the compute module/compute module cartridge to be mounted to the display stand, while the cabling is connected to the compute module. As such, a cartridge-based computing system is provided that addresses many issues associated with conventional "all-in-one" computing systems by providing a compute module cartridge that may connect different compute modules to different display stands, with the compute module capable of being utilized as a "stand alone" computer, or included in a display stand to mimic an "all-in-one" computing device experience.

The method 500 begins at block 502 where a compute module cartridge is coupled to a compute module. In an embodiment, at block 502, the compute module cartridge 300 discussed above with reference to FIGS. 3A and 3B is coupled to the compute module 200 discussed above with reference to FIGS. 2A and 2B. For example, FIG. 6A-6F illustrates how the compute module 200 may be moved into the compute module housing 304 defined by the compute module cartridge 300 by, for example, positioning the bottom edge 202d of the compute module 200 adjacent the top edge 302a of the compute module cartridge 300 such that the compute module 200 is aligned with the compute module housing 304, and then moving the compute module 200 a direction C into the compute module housing 304. In many embodiments, the low-friction surface 305 of the compute module cartridge 300 that is located adjacent the compute module housing 304 prevents aesthetic damage (e.g., scratching) of the outer surface of the compute module 200 during the coupling of the compute module cartridge 300 to the compute module 200. While not illustrated in detail, one of skill in the art in possession of the present disclosure will appreciate how the compute module 200 and compute module cartridge 300 may be configured to provide air gaps, air channels, and/or other airflow passageways that allow airflow past the compute module 200 and/or its components (e.g., airflow that is received via the airflow channels defined by the compute module cartridge 300) in order to provide cooling.

Figure 6A:
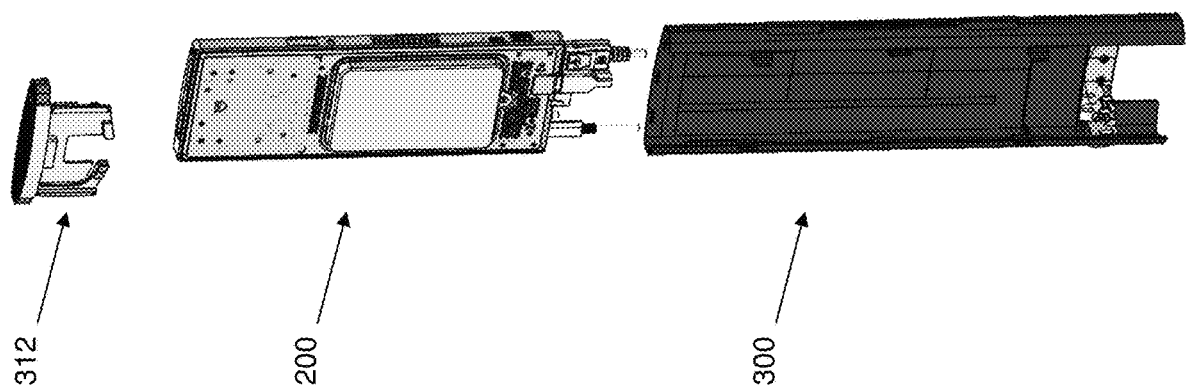
FIG. 6A is an exploded perspective view illustrating an embodiment of the compute module of FIGS. 2A and 2B being coupled to the compute module cartridge of FIGS. 3A and 3B.
Figure 6B:
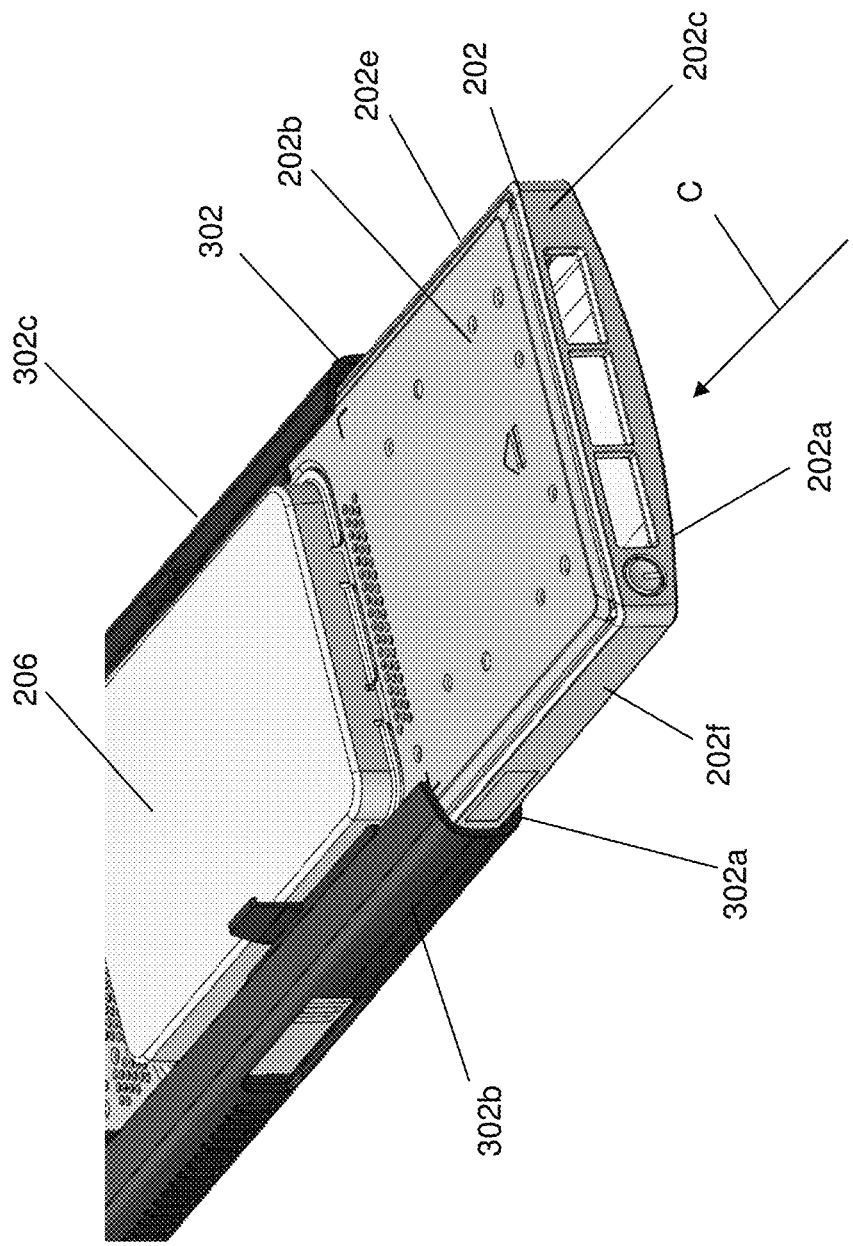
FIG. 6B is a perspective view illustrating an embodiment of the compute module of FIGS. 2A and 2B being coupled to the compute module cartridge of FIGS. 3A and 3B
Figure 6C:
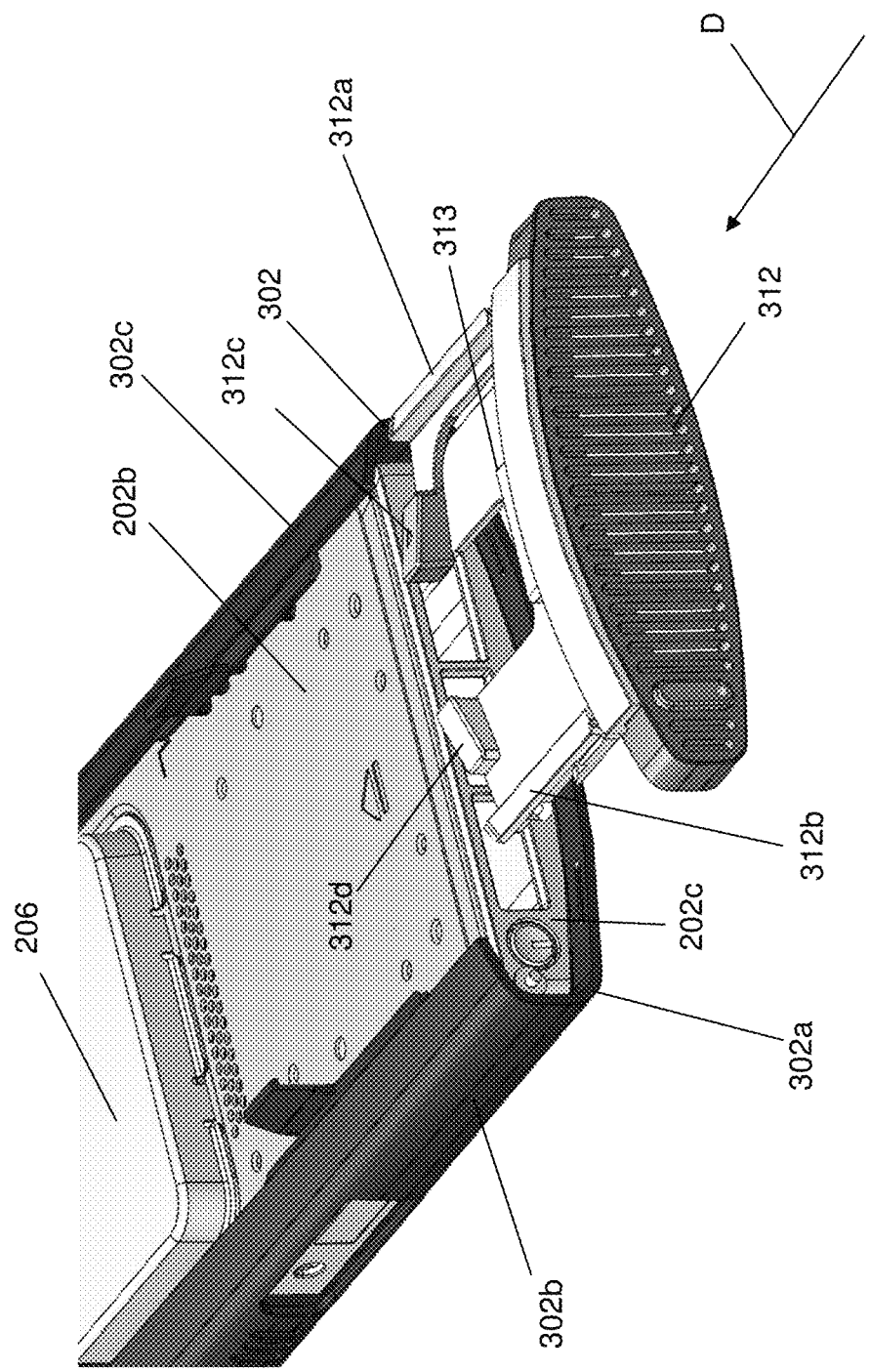
FIG. 6C is a perspective view illustrating an embodiment of the cartridge cap being coupled to the compute module cartridge of FIGS. 3A and 3B.
Figure 6D:
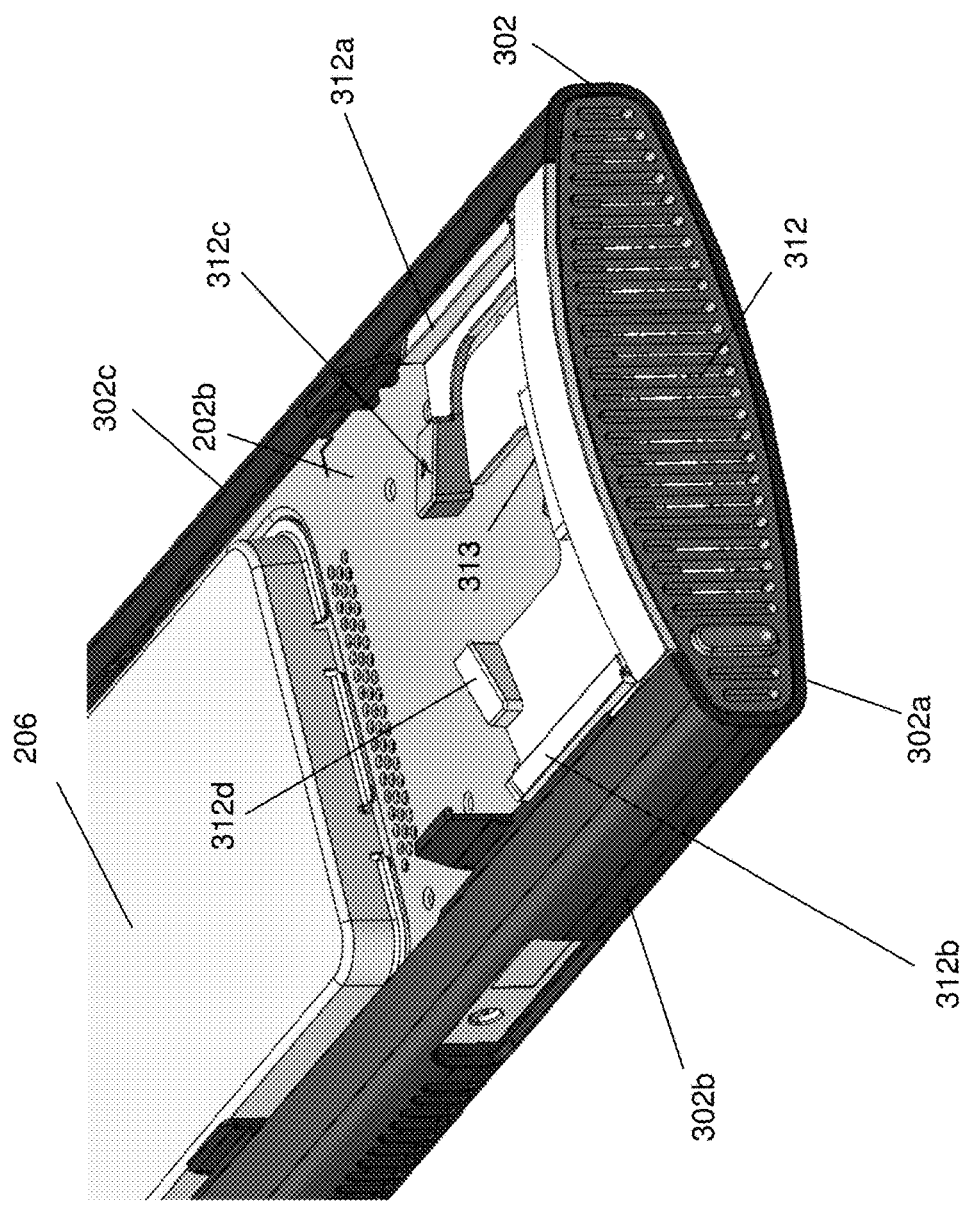
FIG. 6D is a perspective view illustrating an embodiment of the cartridge cap coupled to the compute module cartridge of FIGS. 3A and 3B to secure the compute module of FIGS. 2A and 2B in the compute module cartridge.
Figure 6E:
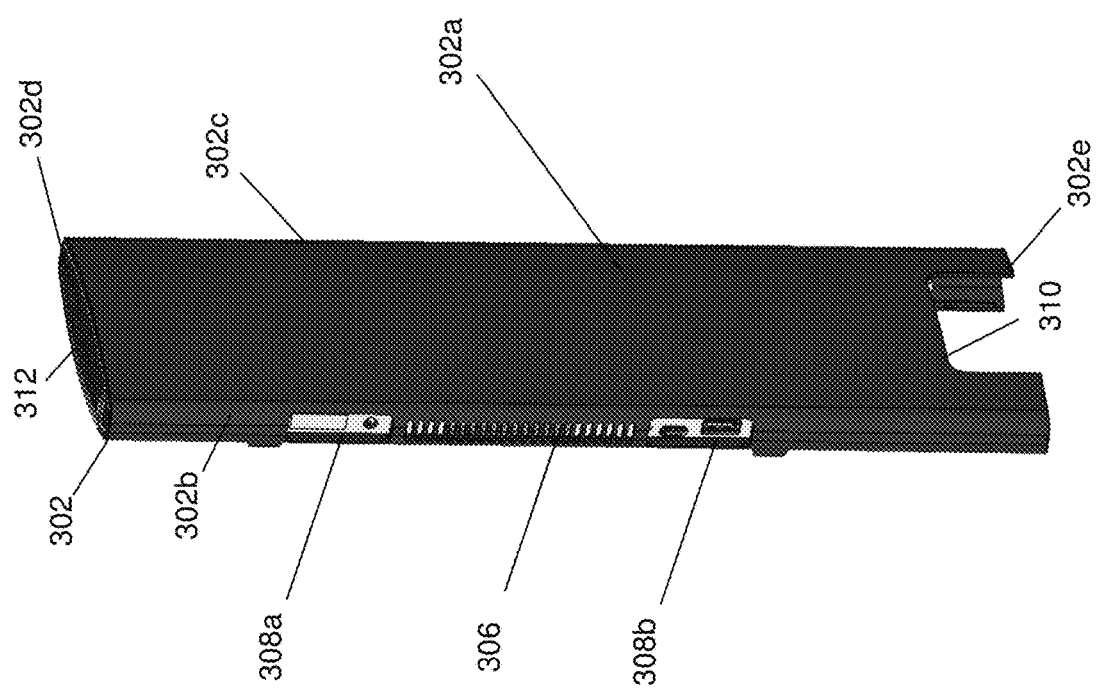
FIG. 6E is a perspective view illustrating an embodiment of the compute module of FIGS. 2A and 2B in the compute module cartridge of FIGS. 3A and 3B.
Figure 6F:
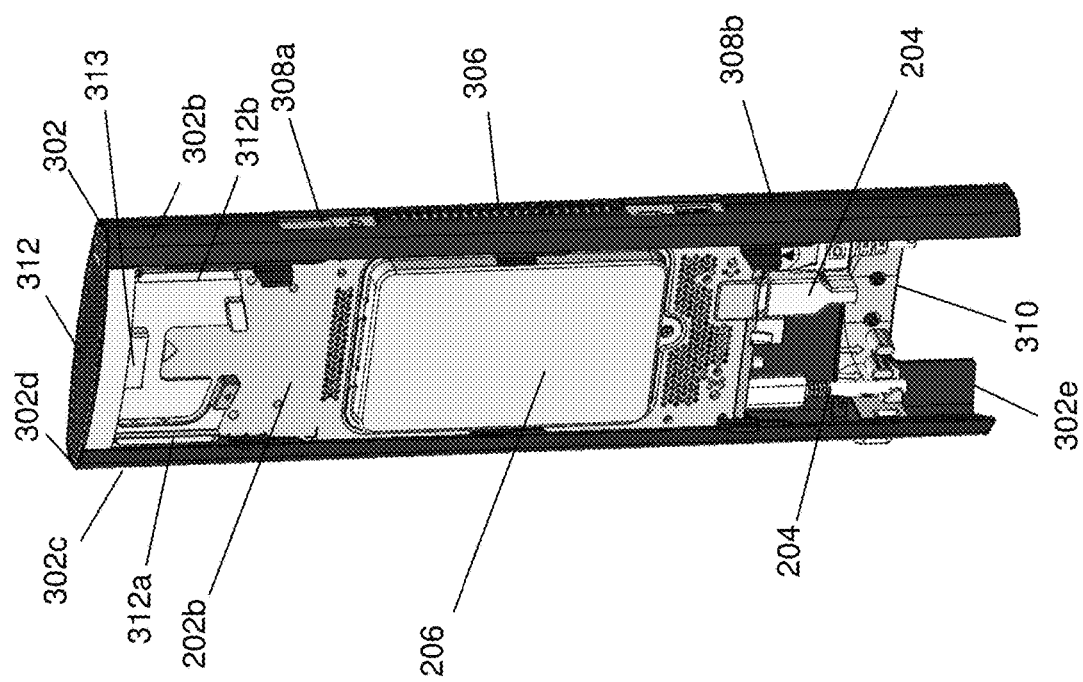
FIG. 6F is a perspective view illustrating an embodiment of the compute module of FIGS. 2A and 2B in the compute module cartridge of FIGS. 3A and 3B.

FIGS. 6C and 6D illustrate how, once of the compute module 200 is located in the compute module housing 304, the cartridge cap 312 may be positioned adjacent the top edge 302a of the compute module cartridge 300 such that the cartridge cap 312 is aligned with the compute module housing 304, and then moved in a direction D such that the coupling arms 312a and 312b on the cartridge cap 312 engage coupling features on the compute module cartridge 300 to connect the cartridge cap 312 to the compute module cartridge 300. While not discussed in detail herein, one of skill in the art in possession of the present disclosure will appreciate how the cartridge cap 314 discussed above with reference to FIG. 3G may be connected to the compute module cartridge 300 in a similar manner. As discussed above, the side walls 302b and 302c on the compute module cartridge 300 may be provided in the "curved" or "wrap-around" orientation illustrated in FIGS. 6A-6F such that those side walls 302b and 302c wrap around the compute module 300, which as illustrated and discussed below allows the compute module cartridge 300/compute module 200 to integrate and "complete" the display stand 400 such that they appears to be a part of the display stand 400, thus allowing the compute module 200 be "hidden in plain sight" as part of the computing system of the present disclosure. As will be appreciated by one of skill in the art in possession of the present disclosure, the coupling of the compute module cartridge 300 to the compute module 200 described above provides a tool-less assembly of the compute module cartridge 300/compute module 200.

With reference to the embodiment of the compute module 200 illustrated in FIGS. 2A and 2B, in some embodiments the cabling 204 may be connected to the compute module 200 prior to the coupling of the compute module cartridge 300 to the compute module 200. However, in other embodiments, the cabling 204 may be connected to the compute module 200 subsequent to the coupling of the compute module cartridge 300 to the compute module 200. As such, the configuration of the compute module cartridge 300 provides flexibility with regard to when the cabling 204 is connected to the compute module 200.

Figure 7A:
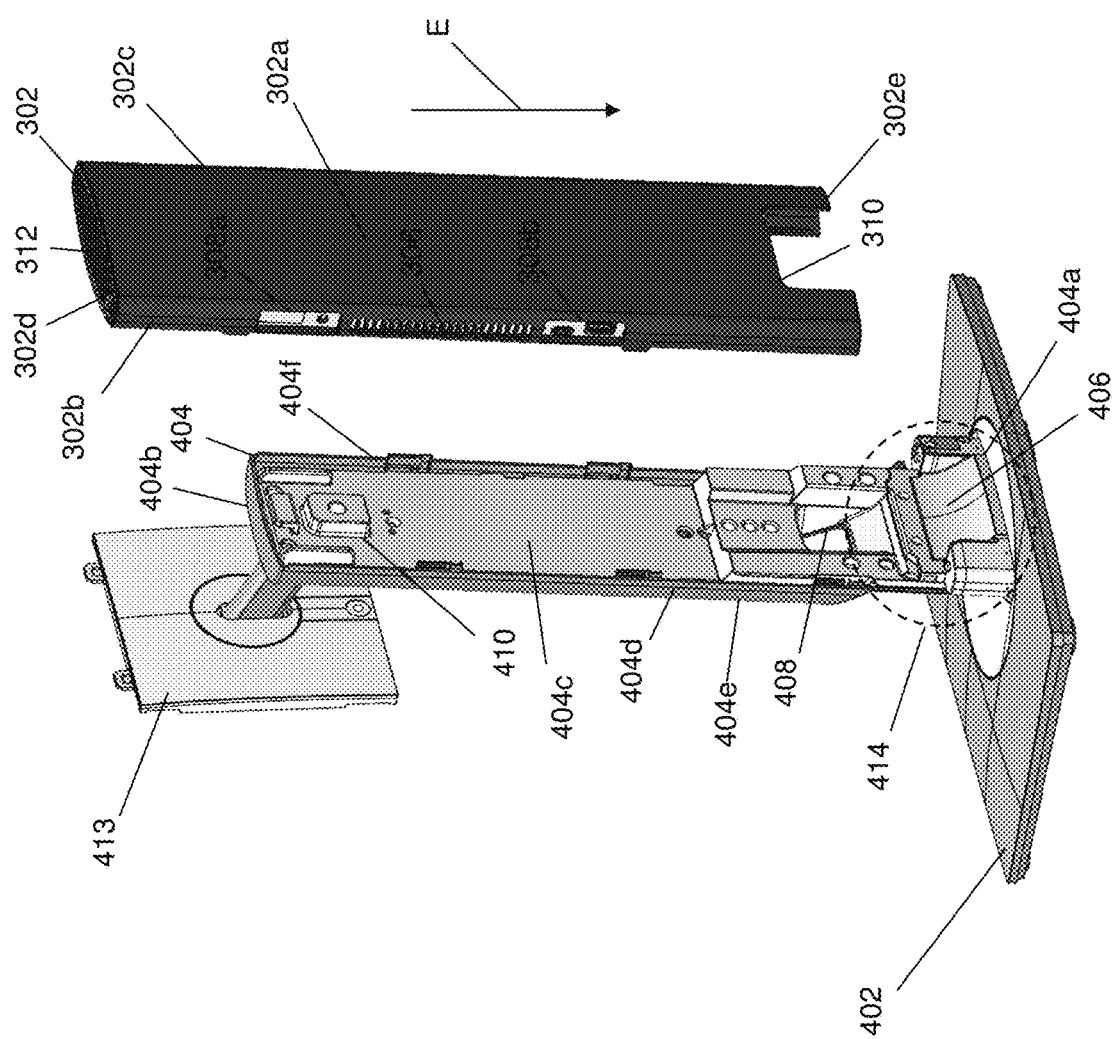
FIG. 7A is a perspective view illustrating an embodiment of the compute module cartridge of FIGS. 3A and 3B being coupled to the display stand of FIGS. 4A-4G.

The method 500 then proceeds to block 504 where the compute module cartridge engages a support member on a display stand and moves in a coupling direction. In an embodiment, at block 504, the compute module cartridge 300 housing the compute module 200 may be engaged with the support member 404 on the display stand 400, and then moved in a coupling direction relative to the support member 404 and towards the coupling subsystem 414. For example, FIG. 7A illustrate how the compute module cartridge 300 may be positioned adjacent the display stand 400 such that the rear surface 202b of the compute module 200 housed in the compute module cartridge 300 is located adjacent the front surface 404c on the support member 404, and one of skill in the art in possession of the present disclosure will recognize how the compute module cartridge 300 may be moved into engagement with the support member 404 (e.g., to engage alignment and coupling features on the compute module cartridge 300 and the support member 404), and then moved in a direction E towards the coupling subsystem 414. In a specific example, the engagement of the compute module cartridge 300 and the support member 404 may include the engagement of the locking feature 411 on the display stand 400 with the securing element 313 on the cartridge cap 312, as well as the engagement of the guide members 412a and 412b on the front surface 404c of the support member 404 with the compute module cartridge 300/compute module 200, which allows the guide members 412a and 412b to align and guide the compute module cartridge 300/compute module 200 as it moves in the direction E towards the coupling subsystem 414.

As will be appreciated by one of skill in the art in possession of the present disclosure, the engagement of the compute module cartridge 300 with the support member 404 and the movement of the compute module cartridge 300 in the direction E and towards the coupling subsystem 414 will cause the cartridge cap engagement element 410 on the front surface 404c of the support member 404 to engage the coupling arms 312a and 312b on the cartridge cap 312 (as well as the engagement of other features on the display stand 400 and the cartridge cap 312) in order to prevent their movement in the direction A illustrated in FIG. 3F. One of skill in the art in possession of the present disclosure will appreciate that preventing the coupling arm 312a from moving in the direction A will prevent the coupling arms 312a and 312b from being disengaged from coupling features on the compute module cartridge 300, thus preventing the removal of the cartridge cap 312 from the compute module cartridge 300 and, in turn, preventing the removal of the compute module 200 from the compute module cartridge 300 as long as the compute module cartridge 300 is connected to the support member 404 on the display stand 400.

The method 500 then proceeds to block 506 where a first display stand securing member on the compute module cartridge engages a securing aperture defined by the support member. In an embodiment, at block 506 and in response to the engagement of the compute module cartridge 300 with the support member 404 and the movement of the compute module cartridge 300 in the direction E and towards the coupling subsystem 414, securing members on the compute module cartridge 300 may engage the coupling subsystem 414 on the support member 404. For example, FIGS. 7B-7E illustrate the first display stand securing member 320a included on the compute module cartridge 300 and biased by the biasing member 324 (e.g., a spring) towards the support member 404 (when the compute module cartridge 300 is coupled to the support member 404), the second display stand securing member 326a included on the compute module cartridge 300 opposite the first display stand securing member 320a, and the release member 328 that is coupled to the second display stand securing member 326a.

Figure 7B:
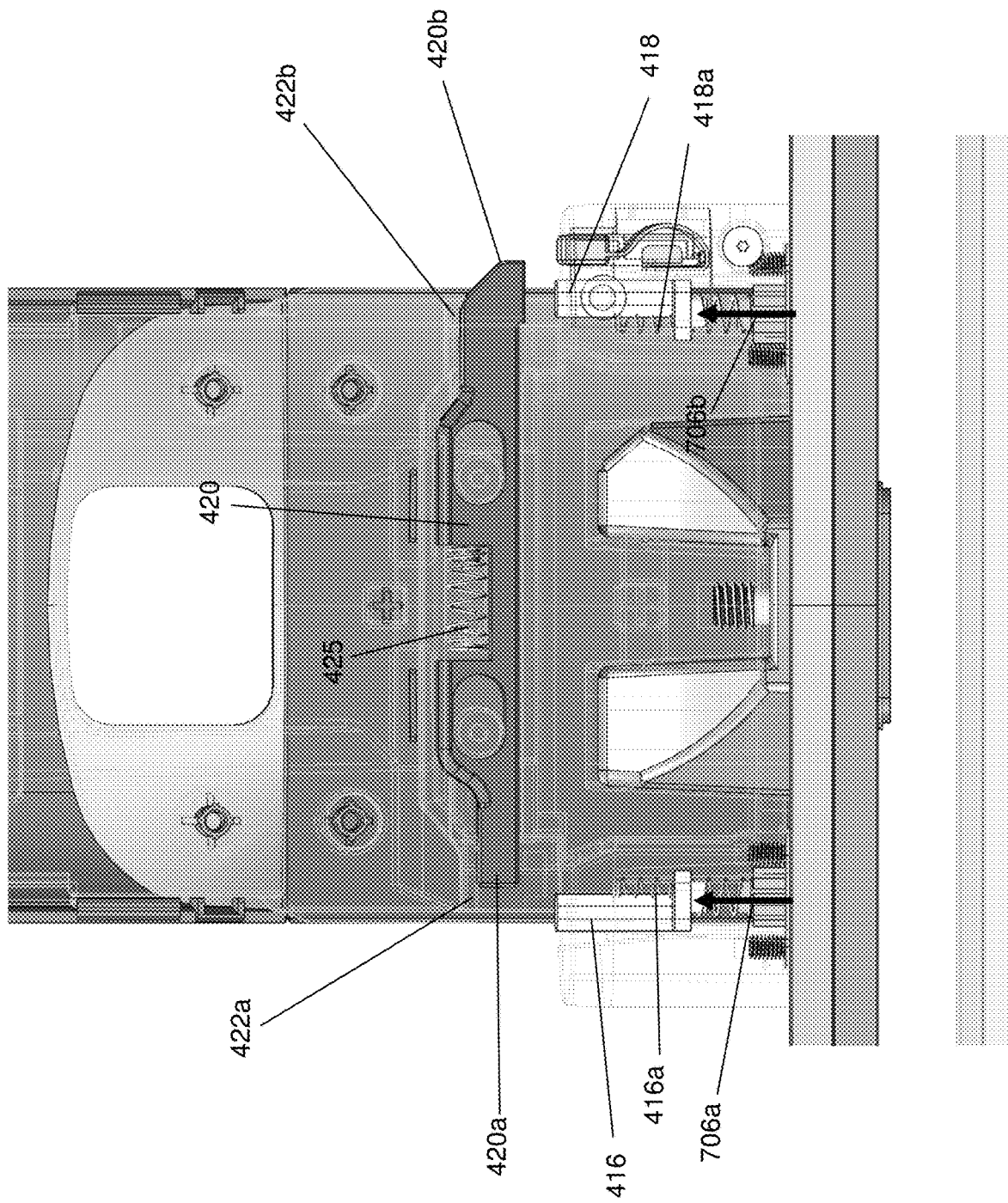
FIG. 7B is a front view illustrating an embodiment of the display stand of FIGS. 4A-4G prior to being coupled to the compute module cartridge of FIGS. 3A and 3B.
Figure 7D:
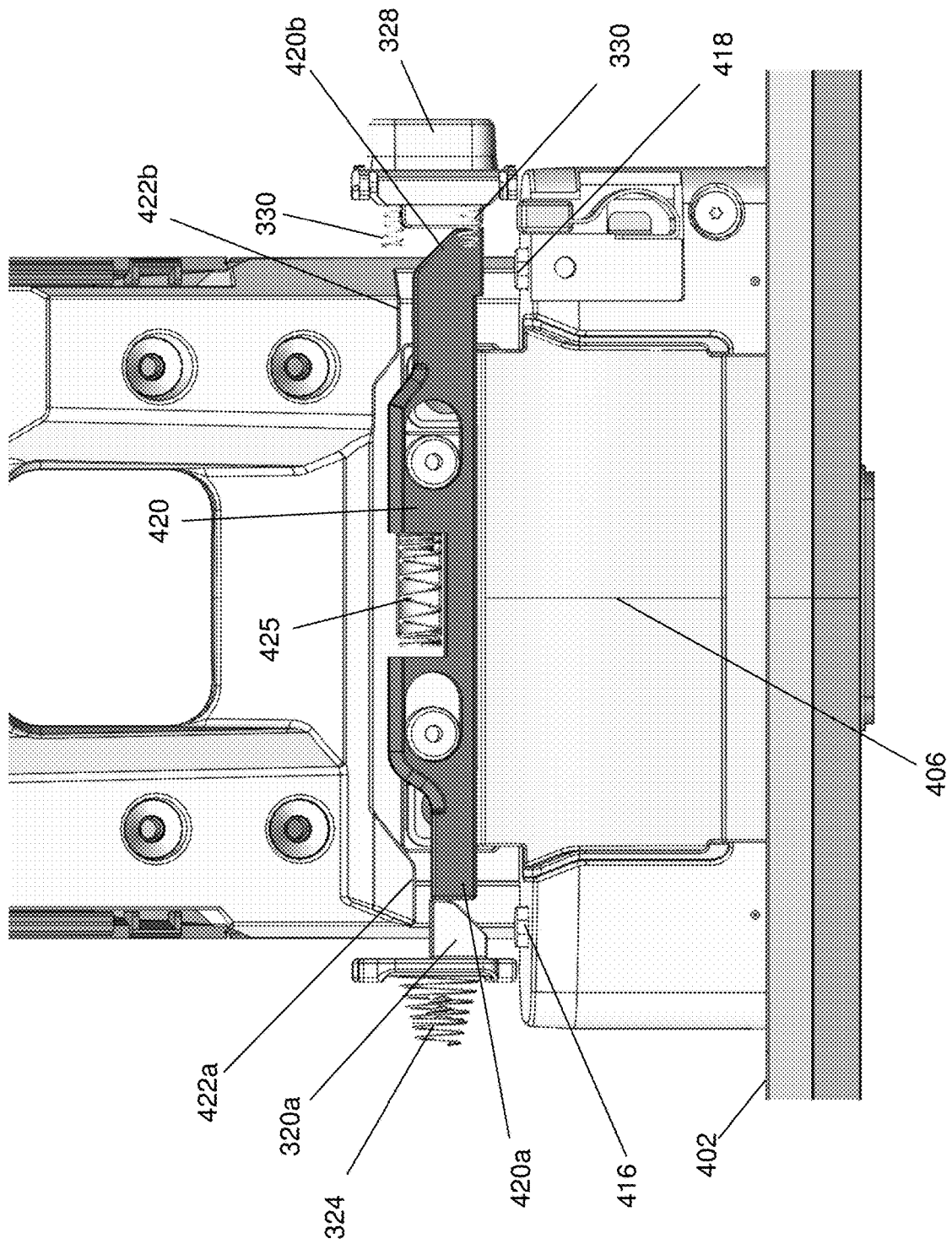
FIG. 7D is a front view illustrating an embodiment of the compute module cartridge of FIGS. 3A and 3B being coupled to the display stand of FIGS. 4A-4G.
Figure 7E:
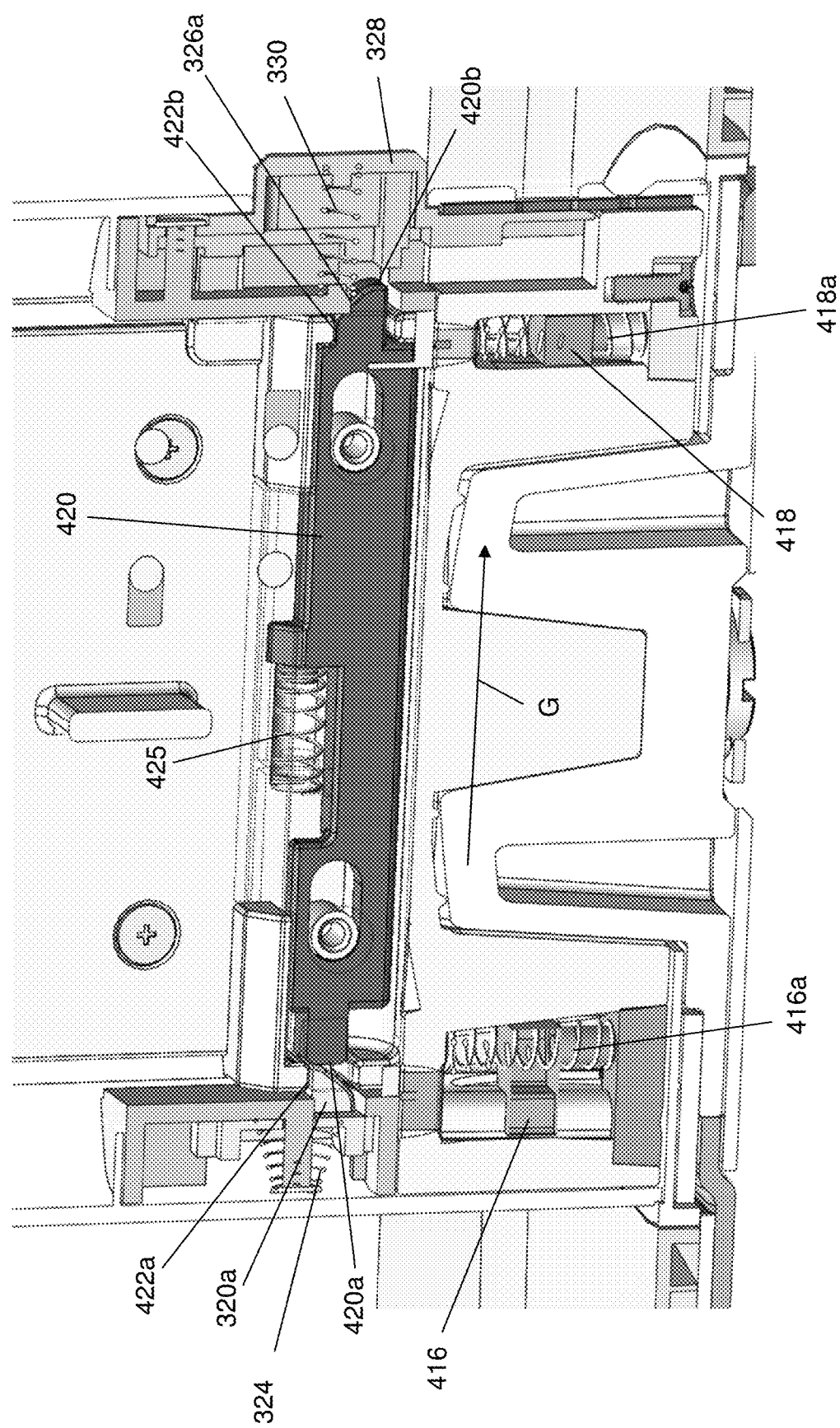
FIG. 7E is a cross-sectional perspective view illustrating an embodiment of the compute module cartridge of FIGS. 3A and 3B being coupled to the display stand of FIGS. 4A-4G.

Furthermore, FIG. 7B illustrates how the biasing elements 416a and 416b provide respective biasing forces 706a and 706b on their respective biasing members 416 and 418 such that, as the compute module cartridge 300 is moved in the direction E towards the coupling subsystem 414, the compute module cartridge 300 engages the biasing members 416 and 418 and is resisted by the biasing forces 706a and 706b. FIG. 7C illustrates how, in response to the engagement of the compute module cartridge 300 and the biasing members 416 and 418, the biasing members 416 and 418 will move in a direction F to compress their respective biasing elements 416a and 416b, with the biasing forces 706a and 706b operating to prevent racking by providing a consistent force as the compute module cartridge 300/compute module 200 is connected to (and disconnected from) the coupling subsystem 414. Finally, FIGS. 7D and 7E illustrates how, at block 506 and once the first display stand securing member 700 on the compute module cartridge 300 aligns with the securing aperture 422a defined by the securing element cover 422 on the support member 404, the first display stand securing member 320a will be biased by the biasing member 324 into the securing aperture 422a and engages the securing aperture 422a to secure the first display stand securing member 320a to the support member 404.

The method 500 then proceeds to block 508 where the first display stand securing member on the compute module cartridge engages a securing element in the support member. As also illustrated in FIG. 7D, in an embodiment of block 508 and in response to the first display stand securing member 422a engaging the securing aperture 422a at block 510, the first display stand securing member 320a on the compute module cartridge 300 will engage the first end 420a of the securing element 420. As such, the engagement of the compute module cartridge 300 with the support member 404 and the movement of the compute module cartridge 300 in the direction E and towards the coupling subsystem 414 until the first display stand securing member 320a on the compute module cartridge 300 aligns with the securing aperture 422a causes the first display stand securing member 320a to extend through the securing aperture 422a and into engagement with the first end 420a of the securing element 420.

The method 500 then proceeds to block 510 where the securing element on the support member engages a second display stand securing member in the compute module cartridge. As also illustrated in FIGS. 7D and 7E, in an embodiment of block 510 and in response to the engagement of the first display stand securing member 320a with the first end 420a of the securing element 420, the securing element 420 will move in a direction G such that the second end 420b of the securing element 420 extends out of the securing aperture 422b defined by the securing element cover 422 on the support member 404 and into engagement with the second display stand securing member 326a on the compute module cartridge 300. As such, the engagement of the compute module cartridge 300 with the support member 404 and the movement of the compute module cartridge 300 in the direction E and towards the coupling subsystem 414 until the first display stand securing member 320a on the compute module cartridge 300 aligns with the securing aperture 422a causes the first display stand securing member 320a to extend through the securing aperture 422a and into engagement with the first end 420a of the securing element 420 to move the securing element in the coupling direction G until the second end 420b of the securing element 420 extends through the securing aperture 422b and into engagement with the second display stand securing member 326a.

As will be appreciated by one of skill in the art in possession of the present disclosure, the engagement of the first display stand securing member 320a and the securing aperture 422a and the engagement of the second end 420b of the securing element 420 with the second display stand securing member 326a operates to secure the compute module cartridge 300 to the support member 404 on the display stand 400 as long as the first display stand securing member 320a engages the securing aperture 422a and the second end 420b of the securing element 420 engages the second display stand securing member 326a. Furthermore, the engagement of the first display stand securing member 320a with the securing aperture 422a and the engagement of the second end 420b of the securing element 420 with the second display stand securing member 326a may be configured to create an audible noise or "click" that provides an indication to a user that the compute module cartridge 300/compute module 200 is secured to the display stand 400. Further still, the engagement of the cartridge cap engagement element 410 on the front surface 404c of the support member 404 with the coupling arms 312a and 312b on the cartridge cap 312 (discussed above) secure the compute module 200 in the compute module cartridge 300 as long as the compute module cartridge 300 is secured to the support member 404 on the display stand 400. As will be appreciated by one of skill in the art in possession of the present disclosure, the coupling of the compute module cartridge 300/compute module 200 to the display stand 400 as described above provides for a tool-less assembly of the compute module cartridge 300/compute module 200 and the display stand 400.

Figure 8A:
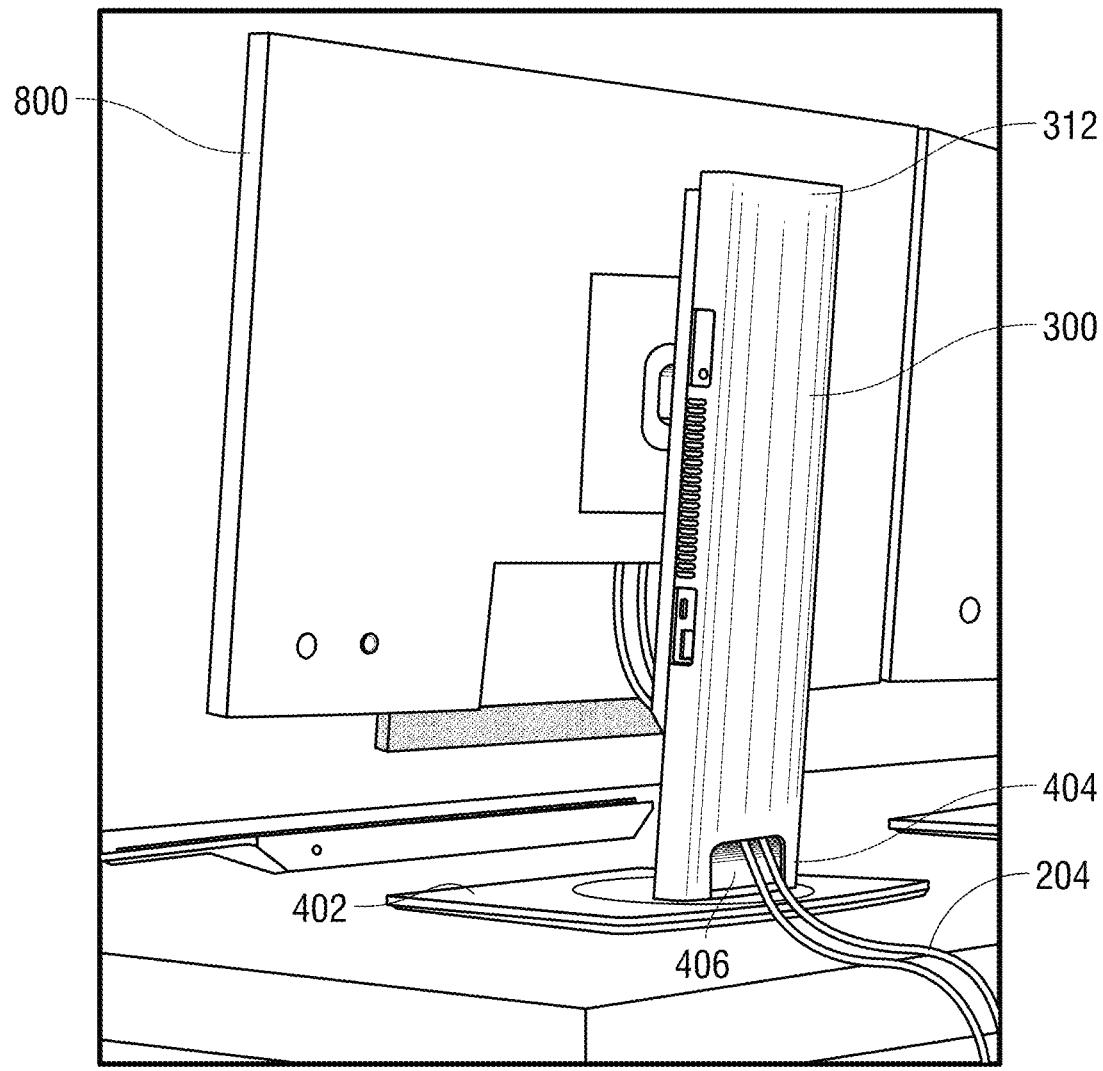
FIG. 8A is a perspective view illustrating an embodiment of the compute module cartridge and compute module of FIG. 6C coupled to the display stand of FIGS. 4A-4G.
Figure 8B:
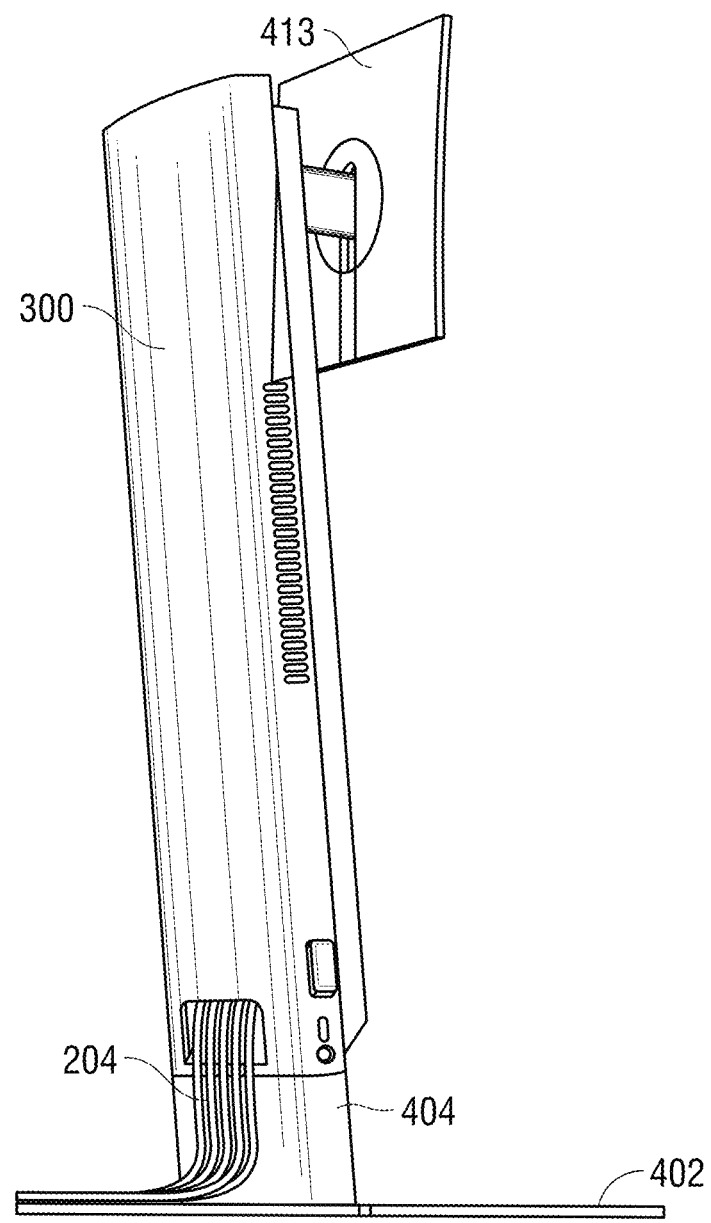
FIG. 8B is a perspective view illustrating an embodiment of the compute module cartridge and compute module of FIG. 6C coupled to an alternate display stand.

As illustrated in FIG. 8A, with the compute module cartridge 300/compute module 200 connected to the support member 404 on the display stand 400, the compute module cartridge 300 provides an integrated portion of the display stand 400 that, as discussed above, "completes" the display stand 400 such that the compute module cartridge 300/compute module 200 appears to be part of the display stand 400, thus hiding the compute module 200 is "in-plain-sight". Furthermore, a display 800 may be mounted to the display mount 413 and coupled to the compute module 200 via cabling 204 that may be routed through the cable routing aperture 408 defined by the support member 404. Further still, FIG. 8B illustrates how the cabling 204 extending from the bottom edge 202d of the compute module 200 may be routed between the cable routing channel 310 defined by the compute module cartridge 300 and the cable routing surface 406 located on the front surface 404c of the support member 404.

As will be appreciated by one of skill in the art in possession of the present disclosure, the cable routing channel 310 defined by the compute module cartridge 300 and the cable routing surface 406 located on the front surface 404c of the support member 404 allow the compute module cartridge 300/compute module 200 to be connected to the display stand 400 as discussed above with the cabling 204 connected to the compute module 200, and may be configured to "clamp" the cabling 204 in order to route and manage that cabling 204. Furthermore, either or both of the compute module cartridge 300 and support member 404 may include features to enable or enhance the clamping and routing of the cabling 204 while remaining within the scope of the present disclosure as well. However, while the compute module cartridge 300/compute module 200 are illustrated and described above as being connected to a particular display stand (e.g., the display stand 400), one of skill in the art in possession of the present disclosure will recognize how an ecosystem of display stands and mounting solutions may be provided for the compute module 200, and the compute module cartridge 300 may be configured to connect to any of those display stands.

Figure 9:
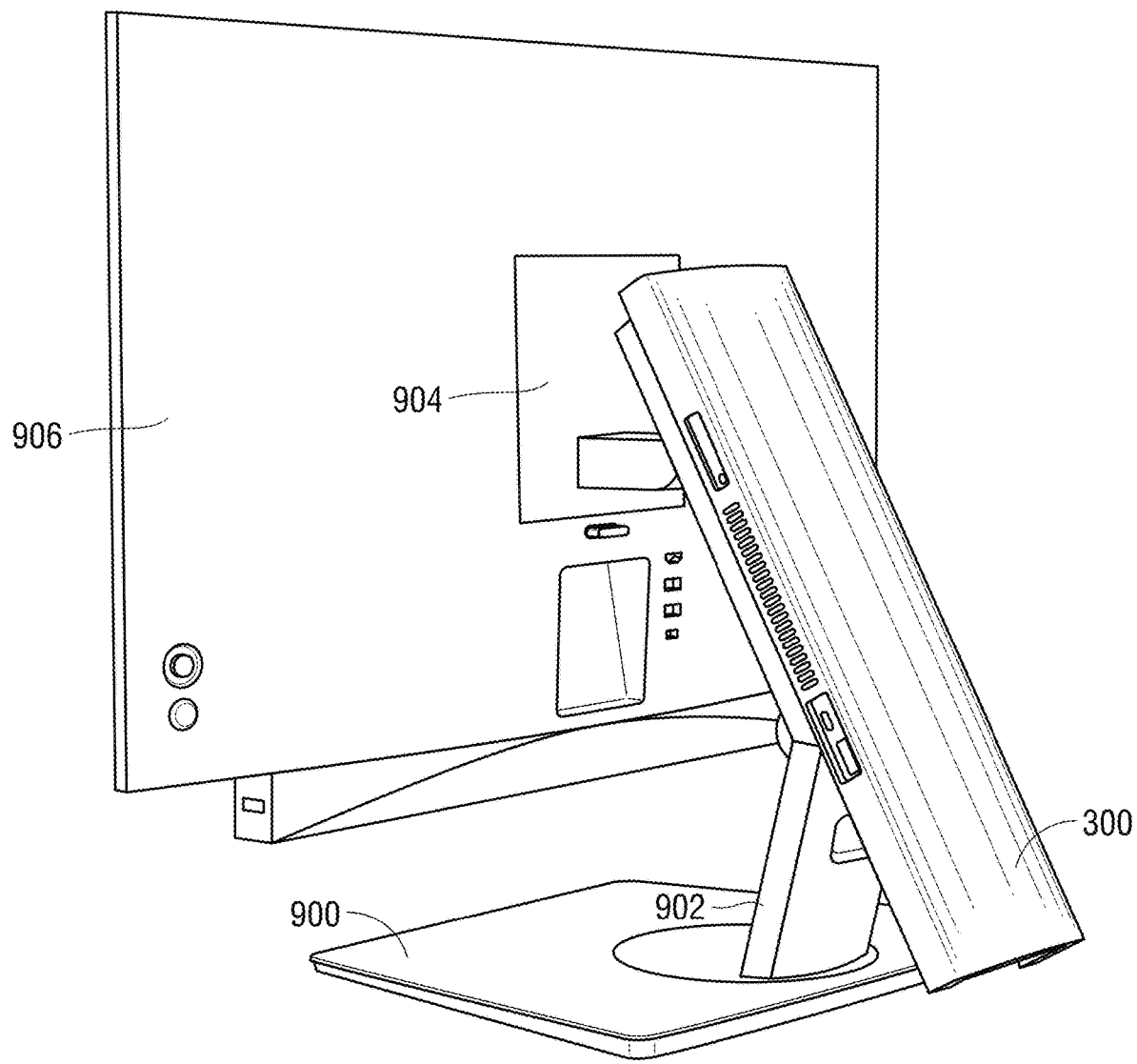
FIG. 9 is a perspective view illustrating an embodiment of the compute module cartridge and compute module of FIG. 6C coupled to an alternate display stand.
Figure 10:
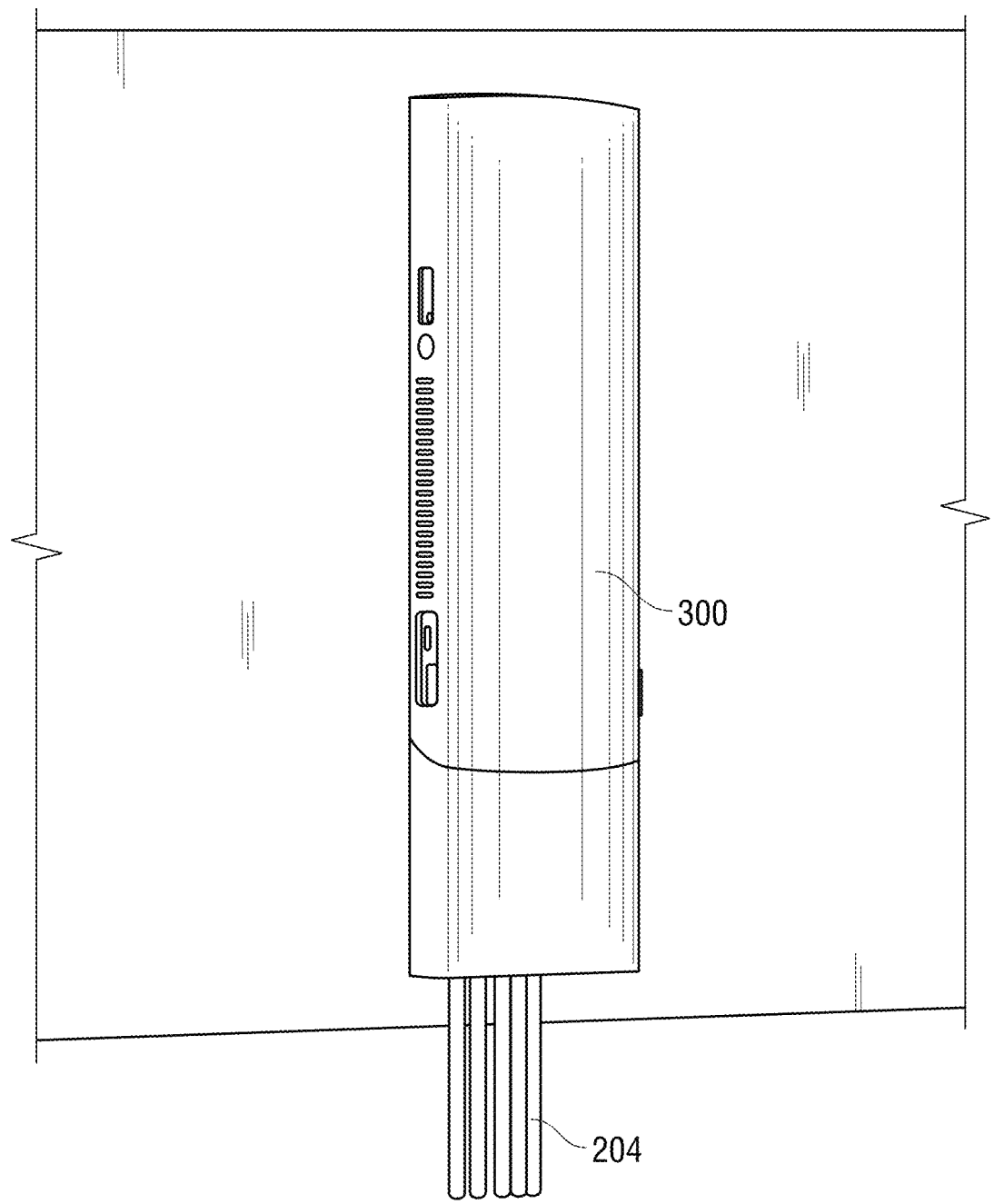
FIG. 10 is a perspective view illustrating an embodiment of the compute module cartridge and compute module of FIG. 6C being coupled to a wall mount.

For example, FIG. 9 illustrates an alternative display stand system including a base 900, a display stand 902 extending from the base 900, and a display mount 904 extending from the display stand 902, and one of skill in the art in possession of the present disclosure will appreciate that the display stand 902 may include at least some of the features discussed above as being included on the display stand 400 in order to allow the compute module cartridge 300/compute module 200 to be connected to the display stand 902 and coupled to a display 906 that is mounted to the display mount 904 while remaining within the scope of the present disclosure as well. In another example, FIG. 10 illustrates how the compute module cartridge 300/compute module 200 may be connected to a wall mount (not visible in FIG. 10) that may include at least some of the features discussed above as being included on the display stand 400 in order to allow the compute module cartridge 300/compute module 200 to be connected to the wall mount. For example, some of the inventors of the present disclosure describe the coupling of a computing device to wall mounts in U.S. patent application Ser. No. 16/946,639, filed on Jun. 30, 2020, the disclosure of which is incorporated herein by reference in its entirety.

Figure 11A:
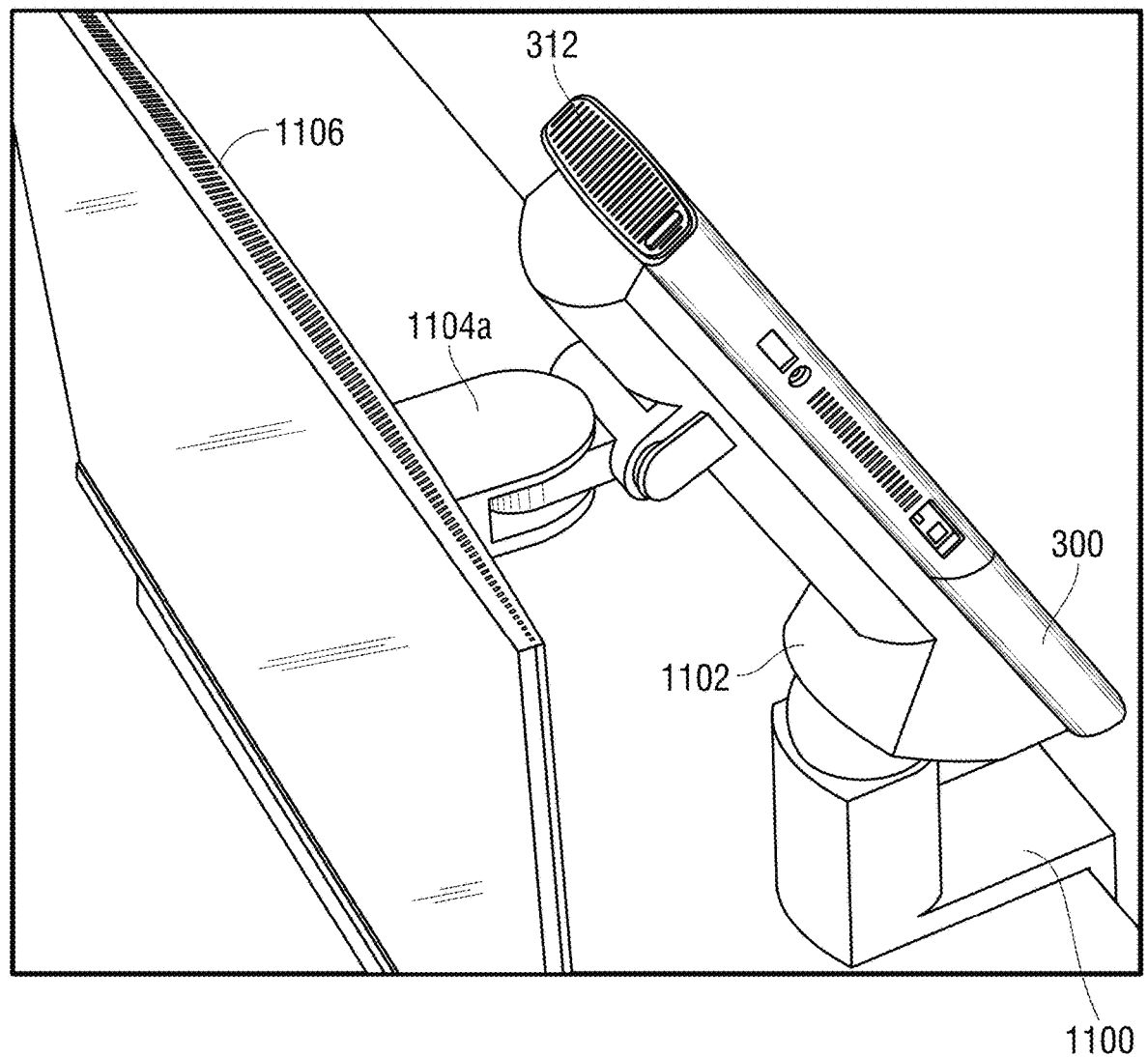
FIG. 11A is a perspective view illustrating an embodiment of the compute module cartridge and compute module of FIG. 6C being coupled to the alternate display stand of FIG. 9A.
Figure 11B:
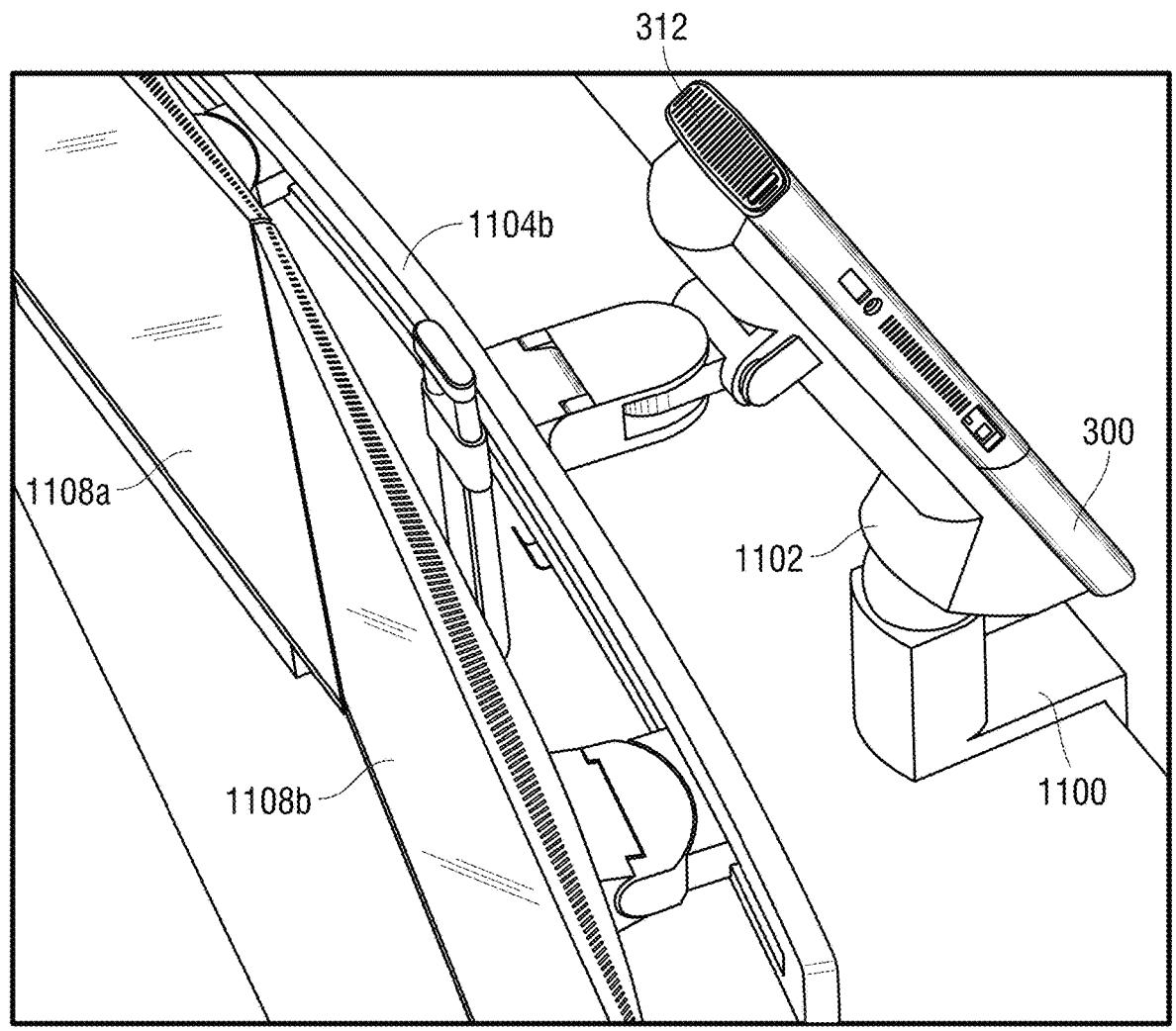
FIG. 11B is a perspective view illustrating an embodiment of the compute module cartridge and compute module of FIG. 6C being coupled to an alternate display stand.

In yet another example, FIGS. 11A and 11B illustrate alternative display stand systems each including a base 1100, a display stand 1102 extending from the base 1100, and display mounts 1104a and 1104b extending from the display stand 1102, and one of skill in the art in possession of the present disclosure will appreciate that the display stand 1102 may include at least some of the features discussed above as being included on the display stand 400 in order to allow the compute module cartridge 300/compute module 200 to be connected to the display stand 1102. Furthermore, one of skill in the art in possession of the present disclosure will appreciate how the display mount 1104a may be a single monitor display mount that is configured to mount to a display 1106 that may be coupled to the compute module 200, while the display mount 1104b may be a dual monitor display mount that is configured to mount to a pair of displays 1108a and 1108b that may be coupled to the compute module 200, while remaining within the scope of the present disclosure as well. However, while the compute module cartridge 300/compute module 200 is illustrated and discussed as being connected to several different display stands and mounting solutions, one of skill in the art in possession of the present disclosure will appreciate that that other display stands and/or mounting solutions may be provided for the compute module cartridge 300/compute module 200 while remaining within the scope of the present disclosure as well. As such, the compute module cartridge 300 may be configured to connect to a variety of display stands and/or mounting solutions in order to enable a user to easily transfer the compute module 200 between display stands and/or mounting solutions and across different working environments as desired.

Figure 12A:
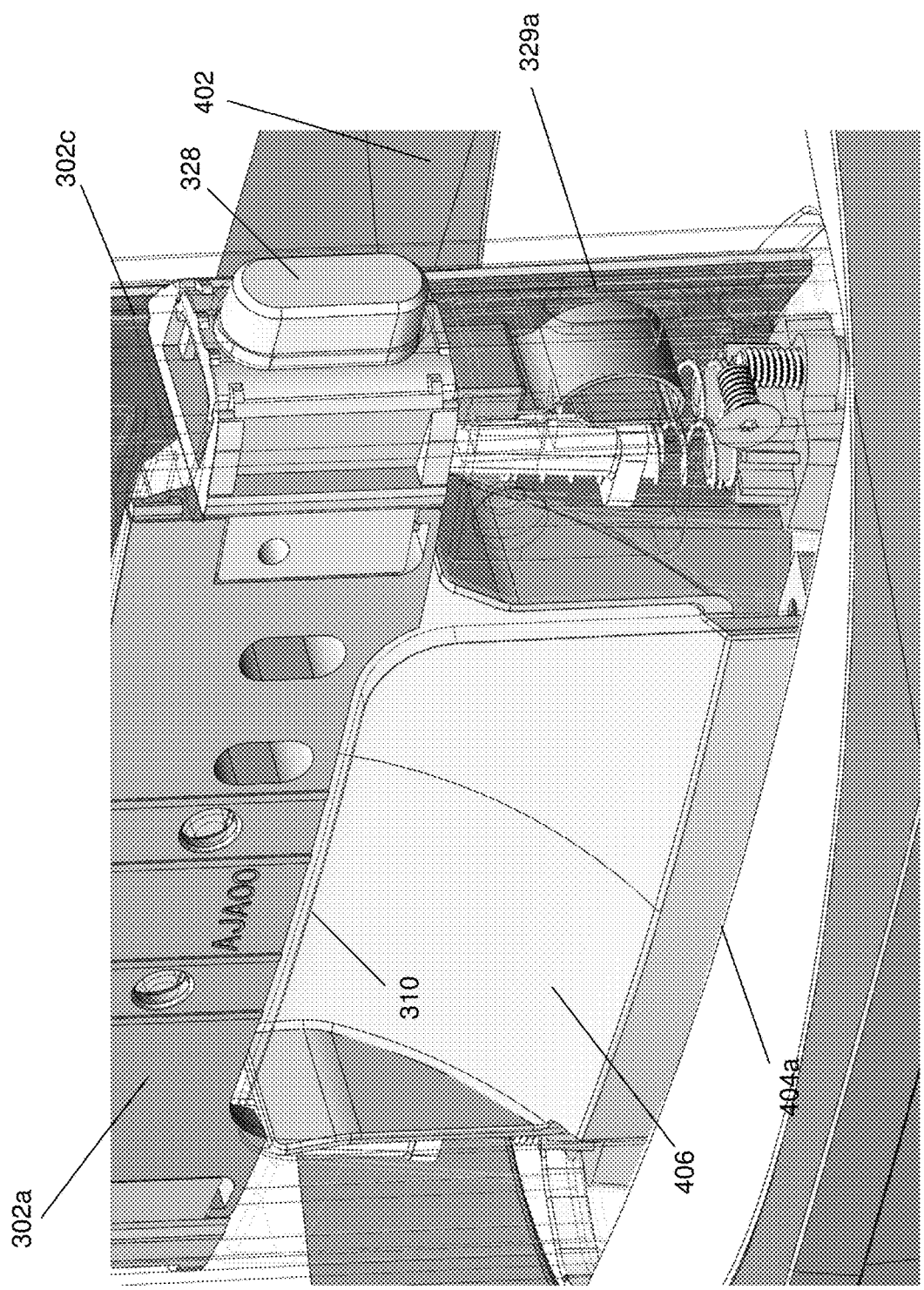
FIG. 12A is a perspective view illustrating an embodiment of a locking feature that allows the compute module cartridge and compute module of FIG. 6C to be locked to the display stand of FIGS. 4A-4G.
Figure 12B:
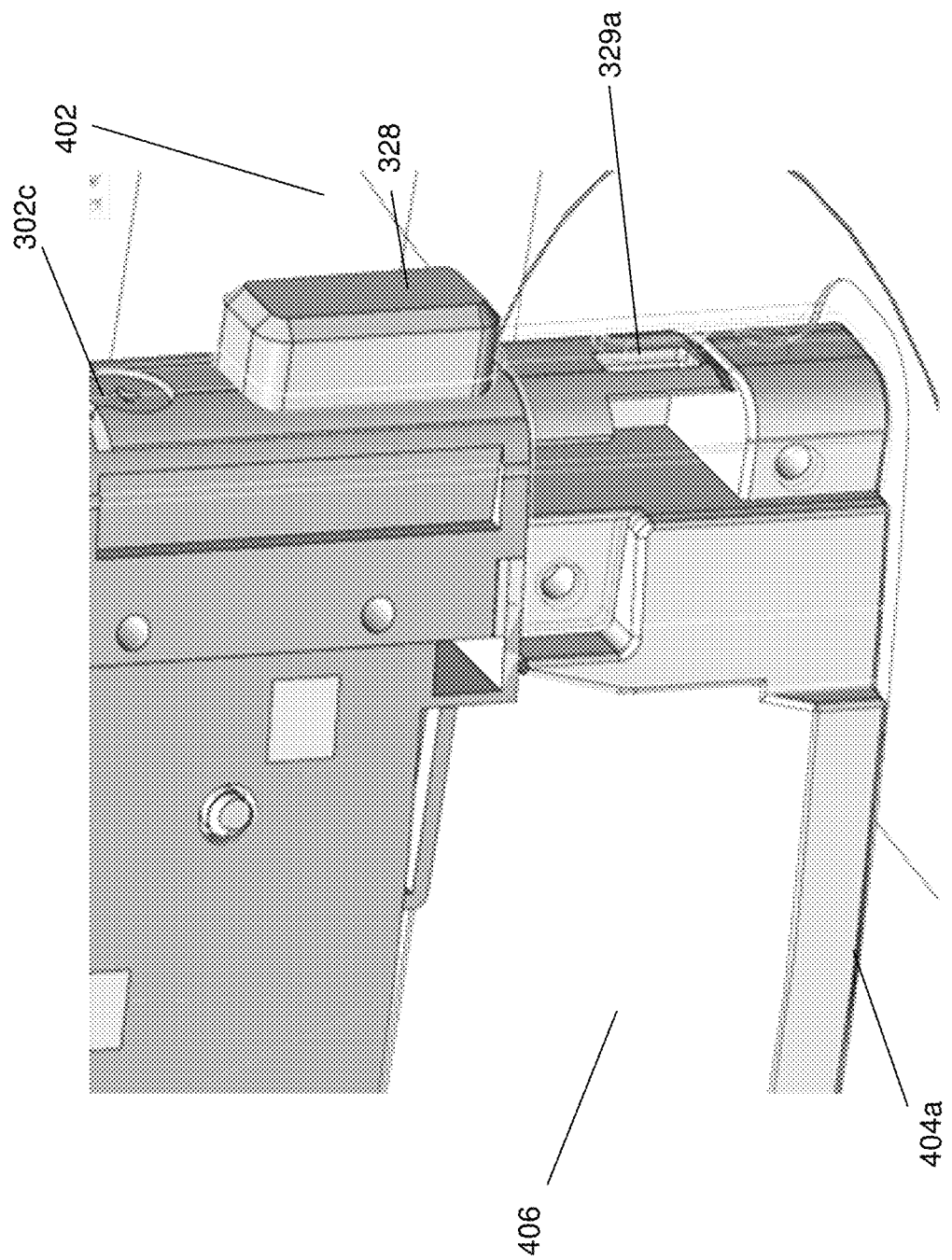
FIG. 12B is a perspective view illustrating an embodiment of the locking feature of FIG. 12A.

Referring now to FIGS. 12A and 12B, an embodiment of the compute module cartridge 300 is illustrated that includes the side wall 302c of the compute module cartridge 300 defining the locking aperture 329a that aligns with the locking aperture 424a defined by the locking support 424 on the display stand 400 when the compute module cartridge 300 is secured to the support member 404, and one of skill in the art in possession of the present disclosure will appreciate how a locking device (e.g., a KENSINGTON® locking device as discussed above) may be provided in each of the locking apertures 329a and 424a in order to lock the compute module cartridge 300/compute module 200 to the display stand 400. While not illustrated herein, one of skill in the art in possession of the present disclosure will appreciate how a locking screw may be provided in the locking aperture 329b to provide similar locking functionality as well. Furthermore, one of skill in the art in possession of the present disclosure will appreciate how the locking of the compute module cartridge 300/compute module 200 to the display stand 400 prevents the removal of the compute module 200 from the compute module cartridge 300 due to the engagement of the cartridge cap engagement element 410 and the coupling arms 312a and 312b on the cartridge cap 312, and thus how the locking device discussed above may prevent access to the compute module 200 as well.

Figure 13A:
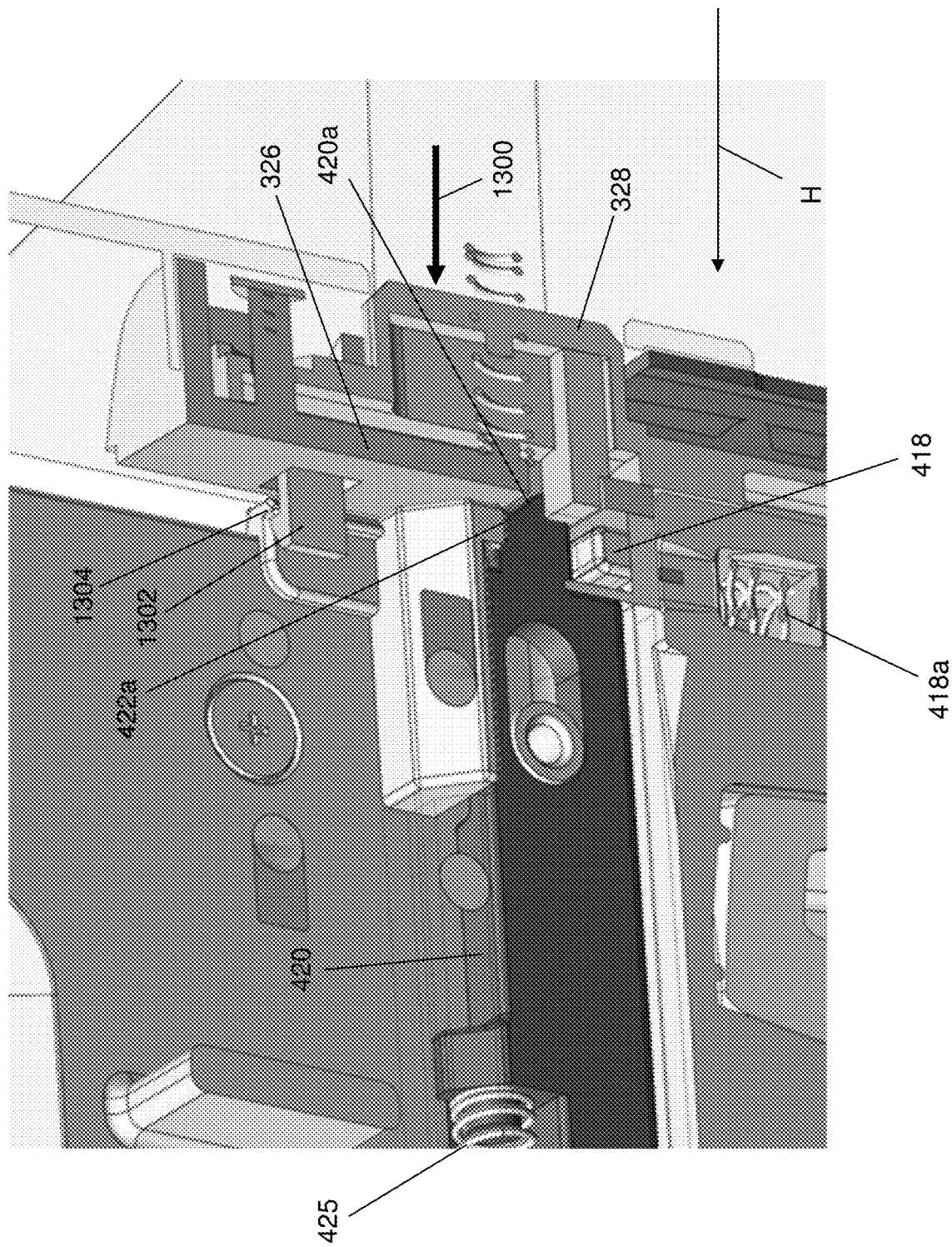
FIG. 13A is a cross-sectional perspective view illustrating an embodiment of the compute module cartridge and compute module of FIG. 6C being decoupled from the display stand of FIGS. 4A-4G.

The method 500 then proceeds to block 512 where a release member on the compute module cartridge is actuated and engages the securing element in the support member. In an embodiment, at block 512 and following the securing of the compute module cartridge 300/compute module 200 to the support member 404 on the display stand 400, a user may wish to disconnect the compute module cartridge 300/compute module 200 from the support member 404 on the display stand 400. As will be appreciated by one of skill in the art in possession of the present disclosure, in situations where the compute module cartridge 300 is locked to the display stand 400 via a locking device (e.g., via the a KENSINGTON® locking device as discussed above), that locking device must first be removed from the locking apertures 329a and 424a defined by the side wall 302c of the compute module cartridge 300, and the locking support 424, respectively. As illustrated in FIG. 13A, in order to disconnect the compute module cartridge 300/compute module 200 from the support member 404 on the display stand 400 at block 512, the user may provide a force 1300 on the release member 328 that causes the release member 328 to move in a direction H and engage the second end 420a of the securing element 420.

The method 500 then proceeds to block 514 where the securing element disengages the second display stand securing member on the compute module cartridge. In an embodiment, at block 514 and in response to continued application of the force 1300 on the release member 328 that causes the release member 328 to move in a direction H, the second end 420a of the securing element 420 will move opposite the direction G (illustrated in FIG. 7E) and into the securing aperture 422a defined by the securing element cover 422 on the support member 404, and will disengage the second display stand securing member 326a.

Figure 13B:
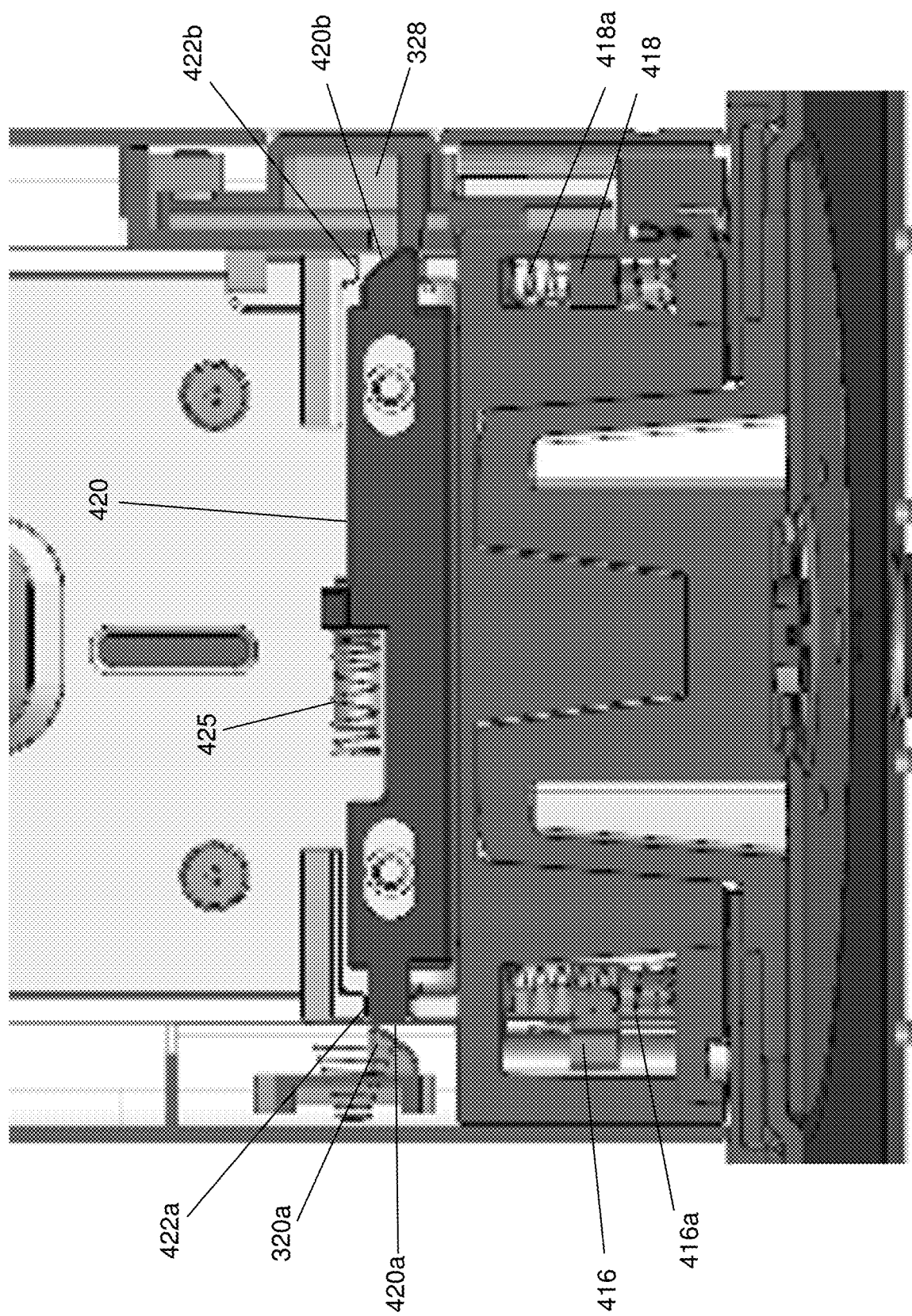
FIG. 13B is a front view illustrating an embodiment of the compute module cartridge and compute module of FIG. 6C being decoupled from the display stand of FIGS. 4A-4G.

The method 500 then proceeds to block 516 where the securing element engages the first display stand securing member on the compute module cartridge. As illustrated in FIG. 13B, in an embodiment of block 516 and in response to the engagement of the release member 328 with the second end 420b of the securing element 420 to move the securing element 420, the first end 420a of the securing element 420 will engage the first display stand securing member 320a and move the first display stand securing member 320a out of the securing aperture 422a defined by the support member 404 such that the first display stand securing member 320a disengages the securing aperture 422a. As will be appreciated by one of skill in the art in possession of the present disclosure, the orientation of the securing element 420 illustrated in FIG. 13B allows the respective biasing forces 706a and 706b provided by the biasing elements 416a and 416b on their respective biasing members 416 and 418 to cause those biasing members 416 and 418 to push the compute module cartridge 300/compute module 200 in the direction of the biasing forces 706a and 706b and partially away from the coupling subsystem 414 on the support member 404 in order to provide a "partial eject" of the compute module cartridge 300/compute module 200 that indicates to the user that the compute module cartridge 300/compute module 200 is now disconnected from the display stand 400.

As such, the compute module cartridge 300/compute module 200 is now disconnected from the support member 404 on the display stand 400, and thus a user may then remove the compute module cartridge 300/compute module 200 from the display stand 400 following block 516. Furthermore, FIG. 13A illustrates how the release member 328 may include a catch feature 1302 that is configured to engage a release member catch element 1304 on the support member 404 in order to hold the release member 328 in the release orientation illustrated in FIG. 13A when the release member 328 is actuated. As such, the release member 328 may remain actuated after the force 1300 is removed to allow the compute module cartridge 300/compute module 200 to be removed from the support member 404 without having to simultaneously provide the force 1300 on the release member 328.

However, while a specific cartridge-based computing system has been described, one of skill in the art in possession of the present disclosure will recognize that a wide variety of modification to the cartridge-based computing system discussed above will fall within the scope of the present disclosure as well. For example, rather than the single button latching coupling subsystem 414 described above, the coupling subsystem on the display stand 400 may be enabled by a "push-push" latching system that allows the compute module 200/compute module cartridge 300 to be connected to the support member 404 on the display stand 400 by pushing the compute module 200/compute module cartridge 300 into engagement with the push-push latching system (which may be accompanied by an audible "click" to confirm the connection of the compute module 200/compute module cartridge 300 to be connected to the support member 404). Furthermore, one of skill in the art in possession of the present disclosure will recognize how such a push-push latching system may allow the compute module 200/compute module cartridge 300 to be disconnected from the support member 404 on the display stand 400 by again pushing the compute module 200/compute module cartridge 300 into engagement with the push-push latching system (which may then "partially eject" the compute module 200/compute module cartridge 300 from the support member 404 similarly as discussed above in order to confirm the disconnection of the compute module 200/compute module cartridge 300 from the support member 404). Finally, one of skill in the art in possession of the present disclosure will appreciate how such a push-push latching system may be locked to prevent the disconnection of the compute module 200/compute module cartridge 300 from the support member 404 similarly as discussed above.

Thus, systems and methods have been described that provide a compute module cartridge that houses a compute module for a computing system and that is configured to be connected to a variety of display stands provided for a computing system family that includes that compute module. Those display stands may include coupling subsystems that provide users a common compute module cartridge coupling and removal experience, and the compute module cartridge may be configured to be to be secured to those display stands such that the compute module cannot be removed from the compute module cartridge. A single cable (e.g., a type-C USB cable) may be utilized to connect the compute module to a display mounted to the display stand, with that cable transmitting data and power between the display and the compute module. The compute module and compute module cartridge may also provide cable routing for cabling connected to the compute module, which may operate to secure and route cables out of the display stand, while allowing the compute module to be coupled to the compute module cartridge, and the compute module/compute module cartridge to be mounted to the display stand, while the cabling is connected to the compute module. As such, a cartridge-based computing system is provided that addresses many issues associated with conventional computing systems by, for example, providing a compute module cartridge that may connect different compute modules to different display stands, with that compute module capable of operating as a "stand-alone" computer, or included in a display stand to provide an "all-in-one" desktop computing experience.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A cartridge-based computing system, comprising:
a compute module cartridge that includes a mount securing subsystem and that is configured to house a compute module;
a mount that includes:
a cartridge securing subsystem that is configured to engage the mount securing subsystem on the compute module cartridge in order to secure the compute module cartridge to the mount; and
a cartridge cap engagement element that is configured to engage a cartridge cap on the compute module cartridge when the compute module cartridge is secured to the mount in order to prevent removal of the cartridge cap from the compute module cartridge and secure a compute module that is housed in the compute module cartridge; and
a release subsystem that is configured to disengage the cartridge securing subsystem on the mount from the mount securing subsystem on the compute module cartridge in order to allow the compute module cartridge to be disconnected from the mount.

2. The system of claim 1, wherein the cartridge cap on the compute module cartridge includes:
at least one coupling arm that is movable between a secured orientation in which the at least one coupling arm engages the compute module cartridge to prevent removal of the cartridge cap from the compute module cartridge, and a unsecured orientation in which the at least one coupling arm disengages the compute module cartridge to allow removal of the cartridge cap from the compute module cartridge, wherein the engagement of the cartridge cap engagement element and the cartridge cap when the compute module cartridge is secured to the mount prevents movement of the at least one coupling arm to the unsecured orientation.

3. The system of claim 1, wherein the release subsystem is configured to remain in a release orientation when the release subsystem is actuated to disengage the cartridge securing subsystem on the mount from the mount securing subsystem on the compute module cartridge until the compute module cartridge is disconnected from the mount.

4. The system of claim 1, wherein the mount includes:
a cartridge locking subsystem that is configured to accept a lock device in order to lock the compute module cartridge to the mount.

5. The system of claim 1, wherein the mount includes one of a display stand or a wall mount.

6. The system of claim 1, wherein the mount includes:
at least one biasing subsystem that is configured to engage the compute module cartridge when the compute module cartridge is connected to the mount in order to provide a biasing force on the compute module cartridge, and wherein the biasing force is configured to move the compute module cartridge out of the mount when the cartridge securing subsystem on the mount is disengaged from the mount securing subsystem on the compute module cartridge.

7. An Information Handling System (IHS), comprising:
a compute module that includes:
  a processing system; and
  a memory system that is coupled to the processing system and that includes instructions that, when executed by the processing system, cause the processing system to provide computing operations;
a compute module cartridge that includes a mount securing subsystem and that is configured to house the compute module;
a mount that includes:
  a cartridge securing subsystem that is configured to engage the mount securing subsystem on the compute module cartridge in order to secure the compute module cartridge to the mount; and
  a cartridge cap engagement element that is configured to engage a cartridge cap on the compute module cartridge when the compute module cartridge is connected to the mount in order to prevent removal of the cartridge cap from the compute module cartridge and secure the compute module when the compute module is housed in the compute module cartridge; and
a release subsystem that is configured to disengage the cartridge securing subsystem on the mount from the mount securing subsystem on the compute module cartridge in order to allow the compute module cartridge to be disconnected from the mount.

8. The IHS of claim 7, wherein the cartridge cap on the compute module cartridge includes:
at least one coupling arm that is movable between a secured orientation in which the at least one coupling arm engages the compute module cartridge to prevent removal of the cartridge cap from the compute module cartridge, and a unsecured orientation in which the at least one coupling arm disengages the compute module cartridge to allow removal of the cartridge cap from the compute module cartridge, wherein the engagement of the cartridge cap engagement element and the cartridge cap when the compute module cartridge is secured to the mount prevents movement of the at least one coupling arm to the unsecured orientation.

9. The IHS of claim 7, wherein the release subsystem is configured to remain in a release orientation when the release subsystem is actuated to disengage the cartridge securing subsystem on the mount from the mount securing subsystem on the compute module cartridge until the compute module cartridge is disconnected from the mount.

10. The IHS of claim 7, wherein the mount includes:
a cartridge locking subsystem that is configured to accept a lock device in order to lock the compute module cartridge to the mount.

11. The IHS of claim 7, wherein the mount includes one of a display stand or a wall mount.

12. The IHS of claim 7, wherein the mount includes:
at least one biasing subsystem that is configured to engage the compute module cartridge when the compute module cartridge is connected to the mount in order to provide a biasing force on the compute module cartridge, and wherein the biasing force is configured to move the compute module cartridge out of the mount when the cartridge securing subsystem on the mount is disengaged from the mount securing subsystem on the compute module cartridge.

13. The IHS of claim 7, wherein the mount includes:
a mount cable routing subsystem is configured to engage cables connected to the compute module when the compute module is housed in the compute module cartridge in order to route the cables from the mount.

14. A method for providing a cartridge-based computing system, comprising:
connecting, by a mount, to a compute module cartridge that houses a compute module;
engaging, by a cartridge securing subsystem that is included on the mount in response to the connection of the compute module cartridge to the mount, with a mount securing subsystem that is included on the compute module cartridge in order to secure the compute module cartridge to the mount;
engaging, by a cartridge cap engagement element that is included on the mount, with a cartridge cap on the compute module cartridge when the compute module cartridge is connected to the mount in order to prevent removal of the cartridge cap from the compute module cartridge and secure the compute module in the compute module cartridge; and
disengaging, by the cartridge securing subsystem that is included on the mount and in response to actuation of a release subsystem, from the mount securing subsystem on the compute module cartridge in order to allow the compute module cartridge to be disconnected from the mount.

15. The method of claim 14, wherein the cartridge cap on the compute module cartridge includes:
at least one coupling arm that is movable between a secured orientation in which the at least one coupling arm engages the compute module cartridge to prevent removal of the cartridge cap from the compute module cartridge, and a unsecured orientation in which the at least one coupling arm disengages the compute module cartridge to allow removal of the cartridge cap from the compute module cartridge, wherein the engagement of the cartridge cap engagement element and the cartridge cap when the compute module cartridge is secured to the mount prevents movement of the at least one coupling arm to the unsecured orientation.

16. The method of claim 14, further comprising:
remaining, by the release subsystem when the release subsystem is actuated to disengage the cartridge securing subsystem on the mount from the mount securing subsystem on the compute module cartridge, in a release orientation until the compute module cartridge is disconnected from the mount.

17. The method of claim 14, further comprising:
accepting, by a cartridge locking subsystem that is included on the mount, a lock device in order to lock the compute module cartridge to the mount.

18. The method of claim 14, wherein the mount includes one of a display stand or a wall mount.

19. The method of claim 14, further comprising:
engaging, by at least one biasing subsystem that is included on the mount, with the compute module cartridge when the compute module cartridge is connected to the mount in order to provide a biasing force on the compute module cartridge; and moving, by the at least one biasing subsystem via the biasing force, the compute module cartridge out of the mount when the cartridge securing subsystem on the mount is disengaged from the mount securing subsystem on the compute module cartridge.

20. The method of claim 14, further comprising:
engaging, by a mount cable routing subsystem that is included on the mount, cables connected to the compute module in order to route the cables from the mount.

* * * * *